(12) United States Patent
Hayashi et al.

(10) Patent No.: US 10,115,768 B2
(45) Date of Patent: Oct. 30, 2018

(54) LIGHT EMITTING DEVICE AND DISPLAY DEVICE

(71) Applicant: NICHIA CORPORATION, Anan-shi (JP)

(72) Inventors: Masaki Hayashi, Anan (JP); Tomohisa Kishimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/658,397

(22) Filed: Jul. 25, 2017

(65) Prior Publication Data

US 2018/0033823 A1 Feb. 1, 2018

(30) Foreign Application Priority Data

Jul. 29, 2016 (JP) .................. 2016-149132

(51) Int. Cl.
*H01L 33/50* (2010.01)
*H01L 27/15* (2006.01)
*H01L 33/58* (2010.01)
*H01L 33/32* (2010.01)

(52) U.S. Cl.
CPC ............ *H01L 27/156* (2013.01); *H01L 33/32* (2013.01); *H01L 33/502* (2013.01); *H01L 33/58* (2013.01)

(58) Field of Classification Search
CPC ....... H01L 27/156; H01L 33/32; H01L 33/58; H01L 33/502; H01L 27/15; H01L 33/50; H01L 33/56; H01L 33/60; H01L 33/62

USPC .......................................................... 257/88
See application file for complete search history.

(56) References Cited

U.S. PATENT DOCUMENTS

| | | | |
|---|---|---|---|
| 2004/0207313 A1 | 10/2004 | Omoto et al. | |
| 2010/0085512 A1* | 4/2010 | Ueda ................. | G02F 1/133609 349/68 |
| 2012/0314156 A1 | 12/2012 | Nozawa | |
| 2013/0126900 A1 | 5/2013 | Inoue et al. | |
| 2017/0324065 A1* | 11/2017 | Lang ................... | H01L 51/5268 |

FOREIGN PATENT DOCUMENTS

| | | |
|---|---|---|
| EP | 2637222 | 9/2013 |
| JP | 07-042150 U | 7/1995 |
| JP | 08-116093 | 5/1996 |
| JP | 10-012926 | 1/1998 |
| JP | 11-340507 | 12/1999 |
| JP | 2000-275636 | 10/2000 |

(Continued)

*Primary Examiner* — Chuong A Luu
(74) *Attorney, Agent, or Firm* — Mori & Ward, LLP

(57) ABSTRACT

A light emitting device includes a first light emitting element, a second light emitting element, a third light emitting element, a fluorescent material, a film, a first lens, a second lens, and a third lens. The first light emitting element is to emit a first light having a peak wavelength in a range from 440 nm to 485 nm. The second light emitting element is to emit a second light having a peak wavelength in a range from 495 nm to 573 nm. The third light emitting element is configured to emit from a third front surface a third light having a peak wavelength in a range from 440 nm to 485 nm. The fluorescent material is provided on the third front surface and has a fluorescent side surface extending along a front-rear direction. The film is provided to surround the side surface and the fluorescent side surface.

23 Claims, 16 Drawing Sheets

(56) References Cited

FOREIGN PATENT DOCUMENTS

| | | |
|---|---|---|
| JP | 2002-217454 | 8/2002 |
| JP | 2003-068109 | 3/2003 |
| JP | 2004-327492 | 11/2004 |
| JP | 2007-027157 | 2/2007 |
| JP | 2008-524831 | 7/2008 |
| JP | 2008-218645 | 9/2008 |
| JP | 2013-541855 | 11/2013 |
| JP | 2015-512559 | 4/2015 |
| WO | WO 2006/068297 | 6/2006 |
| WO | WO 2011/067986 | 6/2011 |
| WO | WO 2012/020559 | 2/2012 |
| WO | WO 2013/139624 | 9/2013 |

* cited by examiner

LIGHT EMITTING DEVICE AND DISPLAY DEVICE

CROSS-REFERENCE TO RELATED APPLICATIONS

The present application claims priority under 35 U.S.C. § 119 to Japanese Patent Application No. 2016-149132, filed Jul. 29, 2016. The contents of this application are incorporated herein by reference in their entirety.

BACKGROUND OF THE INVENTION

Field of the Invention

The present disclosure relates to a light emitting device and a display device.

Discussion of the Background

Japanese Unexamined Patent Application Publication No. 08-116093 discloses a photosemiconductor device including a one conductivity type semiconductor layer and an opposite conductivity type semiconductor layer that form a hexagonal column and are a honeycomb shape in a plan view, the one conductivity type semiconductor layer and the opposite conductivity type semiconductor layer being a p-type GaAlAs layer and an n-type GaAlAs layer, a p-type GaAsP layer and an n-type GaAsP layer, a p-type GaP layer and an n-type GaP layer, or a p-type ZnSe layer and an n-type ZnSe layer.

Japanese Unexamined Patent Application Publication No. 2000-275636 discloses a light source that includes a first LED for blue light emission, a second LED for red light emission, a fluorescent filter that converts the wavelength of blue light to emit green light and that emits white light.

Japanese Unexamined Patent Application Publication No. 2004-327492 discloses an LED device including a blue light emitting element, a green fluorescent material having a fluorescent spectrum ranging from 500 nm to 580 nm according to a blue light emitting element, and a red light emitting element. Japanese Unexamined Patent Application Publication No. 2004-327492 also discloses an LED device including a blue light emitting element, a green fluorescent material having a fluorescent spectrum ranging from 500 nm to 580 nm according to a blue light emitting element, and a red fluorescent material having a fluorescent spectrum ranging from 600 nm to 670 nm according to a blue light emitting element.

Japanese Unexamined Patent Application Publication No. 2002-217454 discloses an LED array in which GaN blue LEDs and a GaN green LED are formed on the same sapphire substrate and on one blue LED of the blue LEDs are provided a fluorescent material that is excited by blue light emitted from the blue LED to emit red light, and a bandpass filter or a low pass filter that transmits the red light. In this LED array, blue LEDs and a green LED are arranged on the same sapphire substrate because, only with a combination of conventional monochromatic LEDs to form a full-color display device, it is difficult to form a compact full-color display device due to a configuration of one pixel including three LEDs (red, green, and blue).

Japanese Unexamined Patent Application Publication (Translation of PCT Application) No. 2015-512559 discloses an optoelectronic semiconductor chip that includes a semiconductor layer sequence, a first conversion member, and a second conversion member. The semiconductor layer sequence includes an active layer that generates a primary beam having a peak wavelength of less than 500 nm, and the first conversion member generates a first secondary beam. The semiconductor layer sequence can be driven while controlled electrically independently mutually. The semiconductor layer sequence is divided into a plurality of segments arranged adjacent to each other laterally. The first conversion member and the second conversion member are attached onto main radiation surfaces of the segments, the first secondary beam is colored light and the second secondary beam is white light.

SUMMARY OF THE INVENTION

According to one aspect of the present invention, a light emitting device includes a first light emitting element, a second light emitting element, a third light emitting element, a fluorescent material, a film, a first lens, a second lens, and a third lens. The first light emitting element is to emit from a first front surface a first light having a peak wavelength in a range from 440 nm to 485 nm. The first front surface has a polygonal shape with five or more sides and is substantially perpendicular to a front-rear direction of the light emitting device. The second light emitting element is to emit from a second front surface a second light having a peak wavelength in a range from 495 nm to 573 nm. The second front surface has a polygonal shape with five or more sides and is substantially perpendicular to the front-rear direction. The third light emitting element includes a third front surface, a bottom surface opposite to the third front surface in the front-rear direction, and a side surface connecting the third front surface and the bottom surface. The third light emitting element is configured to emit from the third front surface a third light having a peak wavelength in a range from 440 nm to 485 nm. The third front surface has a polygonal shape with five or more sides and is substantially perpendicular to the front-rear direction. The fluorescent material is provided on the third front surface of the third light emitting element and has a fluorescent side surface extending along the front-rear direction. The film is provided to surround the side surface of the third light emitting element and the fluorescent side surface of the fluorescent material. The first lens is provided over the first front surface of the first light emitting element. The second lens is provided over the second front surface of the second light emitting element. The third lens is provided over the third front surface of the third light emitting element.

According to another aspect of the present invention, a display device includes a plurality of the light emitting devices.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
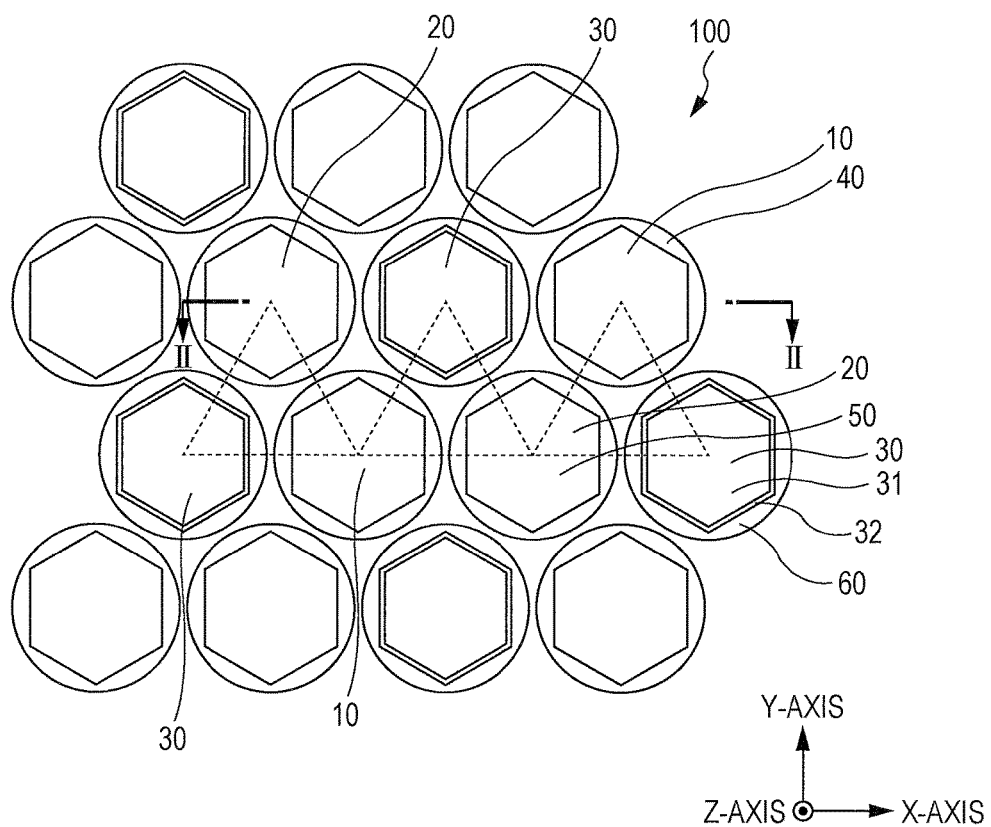
FIG. 1 is a schematic plan view in which a plurality of light emitting devices according to a first embodiment are arranged.

The embodiments will now be described with reference to the accompanying drawings, wherein like reference numerals designate corresponding or identical elements throughout the various drawings.

Hereinafter, light emitting devices according to embodiments and methods for manufacturing a light emitting device are described. The present invention, however, is not limited to these embodiments and examples.

Hereinafter, the light emitting devices according to the present embodiments and the methods for manufacturing a light emitting device are described.

It should be noted, however, that drawings that are to be referred to in the following description schematically illustrate the embodiments, and therefore, the scale of members, the interval between members, the positional relationship of members, and the like are sometimes exaggerated, or a part of a member is sometimes omitted in a drawing. In addition, for example, the scale of members and the interval between members do not sometimes coincide between a plan view and a sectional view of the plan view. Further, in the following description, the same name and symbol basically indicate the same or the same kind of member, and a detailed description of such a member is to be appropriately omitted.

In addition, in the light emitting devices according to the embodiments and the methods for manufacturing a light emitting device, "up," "down," "left," "right," and the like vary according to the situation. In the present specification, "up," "down," and the like indicate a relative position among constituents in a drawing that is referred to for description and are not intended to indicate an absolute position unless otherwise specified.

Further, description is sometimes made by way of an X-axis, a Y-axis perpendicular to the X-axis, and a Z-axis perpendicular to a plane of the X-axis and the Y-axis. A plan view is based on a state in which a light emitting device is placed on the plane of the X-axis and the Y-axis. With a light emitting device placed on the plane of the X-axis and the Y-axis, an upward direction means a Z-axis direction.

Furthermore, the average particle size of particles of, for example, a light reflecting member and a fluorescent material is based on an air permeability method or Fisher Sub-Sieve Sizers unless otherwise specified.

In the present specification, the relationship between a color name and a chromaticity coordinate, the relationship between a wavelength range of light and a color name of monochromatic light, and the like are in accordance with JIS (Japanese Industrial Standards) Z8110 unless otherwise specified. Specifically, a monochromatic light having a wavelength ranging from 380 nm to 455 is blue-violet, a monochromatic light having a wavelength ranging from 455 nm to 485 nm is blue, a monochromatic light having a wavelength ranging from 485 nm to 495 nm is blue-green, a monochromatic light having a wavelength ranging from 495 nm to 548 nm is green, a monochromatic light having a wavelength ranging from 548 nm to 573 nm is yellow-green, a monochromatic light having a wavelength ranging from 573 nm to 584 nm is yellow, a monochromatic light having a wavelength ranging from 584 nm to 610 nm is yellow-red, and a monochromatic light having a wavelength ranging from 610 nm to 780 nm is red.

First Embodiment

Hereinafter, a light emitting device according to a first embodiment is described with reference to drawings.

Figure 2:
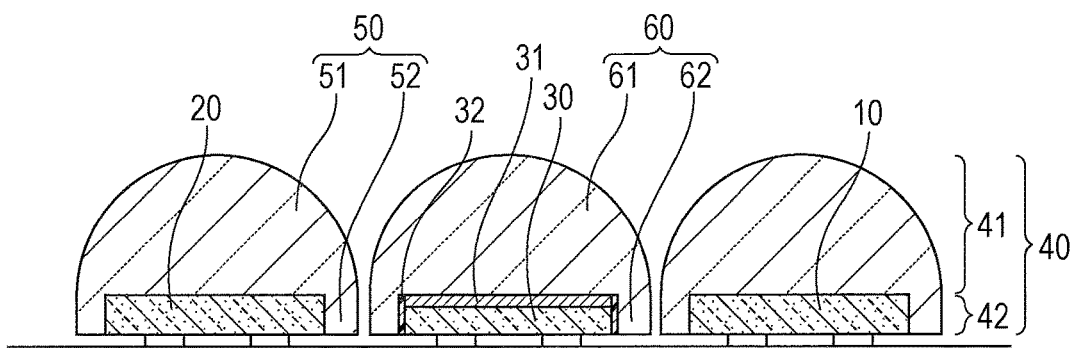
FIG. 2 is a schematic sectional view illustrating a light emitting device according to the first embodiment.
Figure 3:
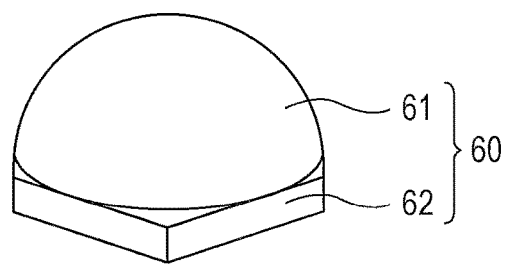
FIG. 3 is a schematic perspective view illustrating a part of the light emitting device according to the first embodiment.
Figure 4:
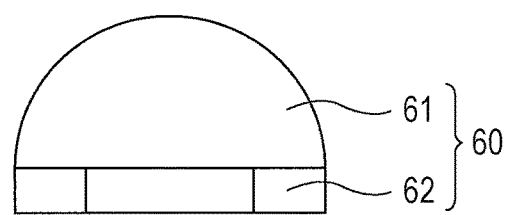
FIG. 4 is a schematic side view illustrating a part of the light emitting device according to the first embodiment.
Figure 5:
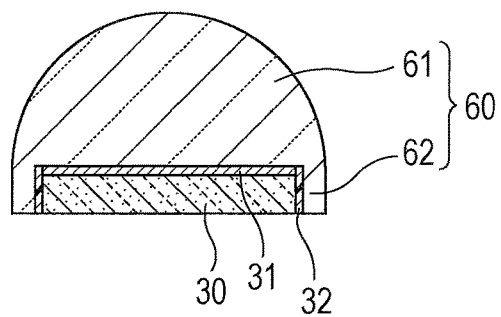
FIG. 5 is a schematic sectional view illustrating a part of the light emitting device according to the first embodiment.
Figure 6:
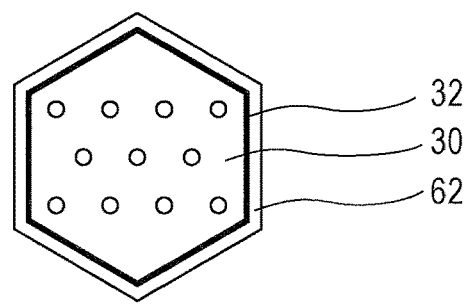
FIG. 6 is a schematic bottom view illustrating a part of the light emitting device according to the first embodiment.
Figure 7:
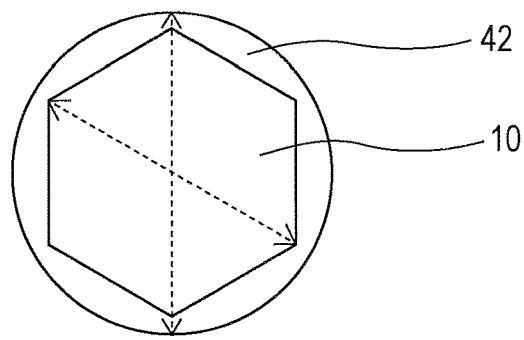
FIG. 7 is a schematic plan view illustrating a part of the light emitting device according to the first embodiment.
Figure 8:
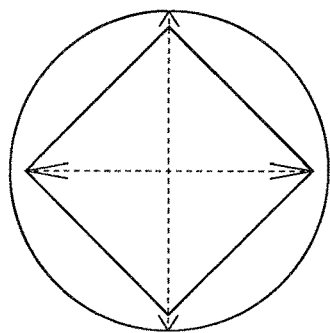
FIG. 8 is a schematic plan view illustrating a part of a light emitting device according to a reference example.

FIG. 1 is a schematic plan view in which a plurality of light emitting devices according to the first embodiment are arranged. FIG. 2 is a schematic sectional view illustrating the light emitting device according to the first embodiment. FIG. 2 is taken along the line II-II in FIG. 1. FIG. 3 is a schematic perspective view illustrating a part of the light emitting device according to the first embodiment and mainly illustrates a third lens. FIG. 4 is a schematic side view illustrating a part of the light emitting device according to the first embodiment and mainly illustrates the third lens. FIG. 5 is a schematic sectional view illustrating a part of the light emitting device according to the first embodiment and mainly illustrates the third lens. FIG. 6 is a schematic bottom view illustrating a part of the light emitting device according to the first embodiment and mainly illustrates a third light emitting element. FIG. 7 is a schematic plan view illustrating a part of the light emitting device according to the first embodiment and mainly illustrates a first light emitting element. FIG. 8 is a schematic plan view illustrating a part of a light emitting device according to a reference example.

Light Emitting Device

A light emitting device 100 includes at least a first light emitting element 10, a second light emitting element 20, and a third light emitting element 30. The first light emitting element 10 forms any one shape selected from a pentagonal shape, a hexagonal shape, a heptagonal shape, and an octagonal shape in a plan view and has a light emission peak wavelength in 440 nm to 485 nm.

The second light emitting element 20 forms any one shape selected from a pentagonal shape, a hexagonal shape, a heptagonal shape, and an octagonal shape in a plan view and has a light emission peak wavelength in 495 nm to 573 nm. The third light emitting element 30 forms any one shape selected from a pentagonal shape, a hexagonal shape, a heptagonal shape, and an octagonal shape in a plan view and has a light emission peak wavelength in 440 nm to 485 nm. Here, the first, second, and third light emitting elements 10, 20, and 30 are described as each having a hexagonal shape. A third fluorescent material 31 (a fluorescent material 31) is provided on a plane of the third light emitting element 30. A third film 32 (a film 32) is provided on a side surface of the third light emitting element 30 and a side surface of the third fluorescent material 31. A first lens 40 including at least a first lens portion 41 is disposed over the first light emitting element 10. A second lens 50 including at least a second lens portion 51 is disposed over the second light emitting element 20. A third lens 60 including at least a third lens portion 61 is disposed over the third light emitting element 30. Such configurations can provide the light emitting device 100 that has less color shift and is compact. Particularly, the first to third light emitting elements 10 to 30 including a semiconductor layer favorable in temperature characteristics are used to provide the light emitting device 100 that has less color shift.

That is, in a case of using, as illustrated in a reference example, a light emitting element that has a square shape in a plan view, and a lens, the diameter of the lens needs to be at least the length of a diagonal line of the square shape. In contrast, in a case of using a regular hexagonal light emitting element that has the same area as the area of the square light emitting element in the reference example, the length of a diagonal line of the regular hexagonal shape is shorter than the length of a diagonal line of the square shape. Thus, the diameter of the lens can be shortened, eventually enabling reduction in size of the light emitting device.

Further, in the square light emitting element of the reference example, the difference is large between the distance from the center to a corner of the light emitting element and the shortest distance from the center to a side of the light emitting element, whereas in the regular hexagonal light emitting element, the difference is small between the distance from the center to a corner of the light emitting element and the shortest distance from the center to a side of the light emitting element. As described above, the difference can be reduced between the distance from the center to a corner of the light emitting element and the shortest distance from the center to a side of the light emitting element to reduce the difference between a light emitting part and a non-light emitting part. Particularly, use of a lens that has a circular shape in a plan view can reduce the difference between the light emitting portion and the non-light emitting portion.

The first lens 40 preferably includes a first fixing portion 42 that connects to the first lens portion 41 and that covers at least a side surface of the first light emitting element 10. Such a configuration enables protection of the first light emitting element 10 from, for example, external dust and moisture, leading to easy handling. Further, light output from the side surface of the first light emitting element 10 can be efficiently led to the first lens portion 41.

In the same manner, the second lens 50 preferably includes a second fixing portion 52 that connects to the second lens portion 51 and that covers at least a side surface of the second light emitting element 20. The third lens 60 preferably includes a third fixing portion 62 that connects to the third lens portion 61 and that covers at least a side surface of the third film 32 provided on the side surface of the third light emitting element 30. As described above, the first, second, and third fixing portions 42, 52, and 62 are arranged so as to be adjacent to each other, so that the light emitting device can be densely arranged.

The first fixing portion 42 preferably forms a similar shape to the shape of the first light emitting element 10 in a plan view.

For example, the first light emitting element 10 has a regular hexagonal shape and the first fixing portion 42 also has a regular hexagonal shape. As described above, with the first fixing portion formed in a similar shape to the shape of the first light emitting element, the first lens portion 41 and the first lens 40 can be reduced in size.

In addition, with the first fixing portion formed in a similar shape to the shape of the first light emitting element, light from the first light emitting element 10 can easily enter the first lens portion 41. Further, with the first fixing portion formed in a similar shape to the shape of the first light emitting element, it is possible to keep a constant distance between one surface of the side surfaces of the first light emitting element 10 and one surface of the side surfaces of the first fixing portion 42, so that partial deterioration of the first fixing portion 42 can be reduced. In the same manner, the second fixing portion 52 preferably forms a similar shape to the shape of the second light emitting element 20, and the third fixing portion 62 preferably forms a similar shape to the shape of the third light emitting element 30.

In a plan view, the diameter of the first lens portion 41 is preferably substantially the same as the distance between opposite sides of the first fixing portion 42. Such a configuration enables reduction in size of the first fixing portion 42. Further, such a configuration reduces an area of the first fixing portion 42 that comes out from the first lens portion 41 in a plan view and can make light from the first light emitting element 10 efficiently enter the first lens portion 41.

The first, second, and third light emitting elements 10, 20, and 30 are preferably arranged in a substantially triangular shape in a plan view. Such an arrangement enables efficient mixture of light when the light emitting device is used for a display device such as a display. Here, the centers of the first, second, and third light emitting elements 10, 20, and 30 preferably form a substantially triangular shape.

The first, second, and third light emitting elements 10, 20, and 30 are particularly preferably arranged in a substantially regular triangular shape in a plan view. Such an arrangement enables efficient mixture of light when the light emitting device is used for a display device such as a display. Further, in a case of using a plurality of the light emitting devices, such an arrangement makes it possible to maintain a substantially regular triangular shape also in the relationship with adjacent light emitting devices to realize a more uniform display device. Here, the centers of the first, second, and third light emitting elements 10, 20, and 30 preferably form a substantially regular triangular shape. In the same manner, the first, second, and third lenses 40, 50, and 60 are also preferably arranged in a substantially regular triangular shape. Particularly, the vertexes of the first, second, and third lens portions 41, 51, and 61 are preferably arranged in a substantially regular triangular shape. This is because an image is viewed via lenses in a display device, so that the focal points of the lenses are preferably arranged with a constant interval. Here, the phrase substantially regular triangular shape includes not only a triangle having all the angles at 60 degrees that are formed by connecting the centers of the first, second, and third light emitting elements 10, 20, and 30, but also a triangle having the angles at 50 degrees to 70 degrees.

The first, second, and third light emitting elements 10, 20, and 30 are each preferably a substantially regular hexagonal shape in a plan view. Such a shape enables reduction in size of the lens portion to realize a dense display device. Such a shape enables arrangement of the first, second, and third light emitting elements 10, 20, and 30 in a substantially regular triangular shape.

It is preferable that one side of the first light emitting element 10 be substantially parallel with one side of the second light emitting element 20, one side of the second light emitting element 20 be substantially parallel with one side of the third light emitting element 30, and one side of the third light emitting element 30 be substantially parallel with one side of the first light emitting element 10. Such a configuration enables light emitting devices to be densely mounted. Particularly, sides of light emitting elements adjacent to each other are substantially in parallel to bring the light emitting elements into contact with each other, so that heat from an adjacent light emitting element can be transferred and released. Here, one side of the first light emitting element 10 is to be parallel with one side of the second light emitting element 20. This does not mean, however, that all the sides of the light emitting elements are parallel, respectively, but means that any one side of the first light emitting element 10 that forms any one shape selected from a pentagonal shape, a hexagonal shape, a heptagonal shape, and an octagonal shape is parallel with any one side of the second light emitting element 20 that forms any one shape selected from a pentagonal shape, a hexagonal shape, a heptagonal shape, and an octagonal shape. Particularly, sides of the first and second light emitting elements 10 and 20 that face to each other are preferably in parallel. Here, the phrase substantially parallel includes cases where an angle of inclination from the parallel is 10 degrees or less.

The first, second, and third lens portions 41, 51, and 61 each preferably includes a substantially hemispherical part. Such a configuration enables the first, second, and third lens portions to collect light from the first, second, and third light emitting elements 10, 20, and 30, respectively. Here, the first lens portion 41 and the like have only to have a lens function of collecting light from the light emitting element, and the shape of the first lens portion 41 and the like are not strictly limited to a hemisphere but include one formed by changing the distance from the center so as to have a predetermined angle of light distribution. Alternatively, the shape of the first lens portion 41 and the like is not only one that forms an arc like a hemisphere but also includes one that has a plurality of planes.

It is preferable that the first light emitting element 10 be a substantially hexagonal column, the first fixing portion 42 be a substantially hexagonal column, the first lens portion 41 be substantially hemispherical, and the substantially hexagonal shape of the first light emitting element 10 be disposed along the substantially hexagonal shape of the first fixing portion 42 in a plan view. The phrase disposed along refers to a state in which a corner of the first fixing portion 42 exists on a line from the center toward a corner of the first light emitting element 10. The shape of the first light emitting element 10 includes a flattened hexagonal column whose height is less than the length of a diagonal line of the hexagonal shape of an upper or lower surface of the first light emitting element 10. With such configurations, it is possible to keep a constant distance between one surface of the side surfaces of the first light emitting element 10 and one surface of the side surfaces of the first fixing portion 42, so that partial deterioration of the first fixing portion 42 can be reduced. In the same manner, it is preferable that the second light emitting element 20 be a hexagonal column, the second fixing portion 52 be a hexagonal column, the second lens portion 51 be substantially hemispherical, and the hexagonal shape of the second light emitting element 20 be disposed along the hexagonal shape of the second fixing portion 52 in a plan view. Further, it is preferable that the third light emitting element 30 be a hexagonal column, the third fixing portion 62 be a hexagonal column, the third lens portion 61 be substantially hemispherical, and the hexagonal shape of the third light emitting element 30 be disposed along the hexagonal shape of the third fixing portion 62 in a plan view.

The third light emitting element 30 can be made as high as the first light emitting element 10. With such a configuration, it is possible to use the same member for the first and third light emitting elements 10 and 30. On the other hand, the third light emitting element 30 can be made lower than the first light emitting element 10. The third fluorescent material 31 can be disposed on an upper surface of the third light emitting element 30 to make an upper surface of the third fluorescent material 31 as high as an upper surface of the first light emitting element 10.

The upper surface of the third fluorescent material 31 is preferably as high as or higher than the upper surface of the first light emitting element 10 and an upper surface of the second light emitting element 20. Such a disposition can inhibit the third fluorescent material 31 from being irradiated with light from the first and second light emitting elements 10 and 20 to reduce false lighting. That is, the third fluorescent material 31 can be inhibited from emitting light due to light from the first light emitting element 10, in spite of the fact that the third light emitting element 30 is turned off. The third fluorescent material 31 can be inhibited from unpredictably emitting light in a display device such as a display.

It is preferable that the third fluorescent material 31 absorb light from the third light emitting element 30 and emit light having a light emission peak wavelength in 584 nm to 780 nm. The third fluorescent material 31 emits light having a light emission peak wavelength in more preferably 610 nm to 680 nm, particularly preferably 610 nm to 660 nm. Such a configuration can realize a clear light emission color.

The first, second, and third light emitting elements 10, 20, and 30 are preferably based on the same material. Particularly, the first, second, and third light emitting elements 10, 20, and 30 each preferably include a nitride semiconductor layer. Such a configuration can make the light emitting elements have similar temperature characteristics to reduce color shift associated with variation in temperature of the lateral side surfaces. For example, when a semiconductor having composition of AlGaAs or AlInGaP is used as a light emitting element that emits red light, the light emission color of the red light emitting element largely varies depending on variation in temperature of the lateral side surfaces. In contrast, when one including a nitride semiconductor layer is used as the third light emitting element 30 together with the third fluorescent material 31 that is excited by light from the third light emitting element 30 and emits red light, the color shift in red can be largely reduced.

For example, with use of the first light emitting element 10 including a nitride semiconductor layer that emits blue light, the second light emitting element 20 including a nitride semiconductor layer that emits green light, the third light emitting element 30 including a nitride semiconductor layer that emits blue light, and the third fluorescent material 31 that is excited by light from the third light emitting element 30 and emits red light, light's three primary colors can be realized. It is necessary, however, that most part of the light output from the third light emitting element 30 irradiate the third fluorescent material 31 and most part of the light from the third light emitting element 30 do not exteriorly leak. The third film 32 is provided on a side surface of the third light emitting element 30 and a side surface of the third fluorescent material 31 to prevent light of the first and second light emitting elements 10 and 20 from directly irradiating the third fluorescent material 31, so that false lighting of the third fluorescent material 31 can be prevented. Then, the blue light, the green light, and the red light from the first light emitting element 10, the second light emitting element 20, and the third fluorescent material 31, respectively can be emitted from the first lens 40, the second lens 50, and the third lens 60, respectively to realize various light emission colors.

Here, the third film 32 preferably absorbs or reflects light from the third light emitting element 30. For example, as the third film 32, a film may be formed that includes particles of a black pigment such as carbon. Such a film can increase contrast when the light emitting device 100 is viewed. In addition, such a film absorbs light radiated from the first and second light emitting elements 10 and 20 adjacent to the third light emitting element 30 to irradiate the third film 32, so that alignment can be easily controlled.

Alternatively, as the third film 32, a film may also be formed that includes particles of a white pigment such as titanium oxide. Such a film can reduce the quantity of light absorbed by the third film 32 to increase efficiency of light extraction from the light emitting device 100.

Hereinafter, constituent members are described in detail. In description of the first, second, and third light emitting elements 10, 20, and 30, they are sometimes abbreviated as "light emitting elements," when a common matter among the light emitting elements is described. In addition, the first, second, third lenses 40, 50, and 60 are also sometimes abbreviated as "lenses."

First Light Emitting Element, Second Light Emitting Element, and Third Light Emitting Element As the light emitting elements, semiconductor light emitting elements such as an LED and an LD can be suitably used. The light emitting elements include, for example, a substrate, a semiconductor stacked body, an n-side electrode, and a p-side electrode. The light emitting elements includes on a substrate a semiconductor stacked body that has an LED structure. As the light emitting elements, it is possible to use not only a type that has, on the same surface side, electrodes different in polarity, but also a type that has, on different surfaces, electrodes different in polarity.

As the light emitting elements, suitably used is one that is formed by stacking on a substrate a semiconductor such as SiC, GaN, InN, AlN InGaN, AlGaN, or AlInGaN by a liquid phase growth method, an HYPE method, an MBE method, or an MOCVD method. As a semiconductor material, a gallium nitride-based semiconductor represented by $In_X Al_Y Ga_{1-X-Y}N$ ($0 \leq X$, $0 \leq Y$, $X+Y<1$) can be more suitably used because a predetermined light emission wavelength can be variously selected by selecting a degree of mix crystallinity.

As the light emitting elements, any one shape selected from a pentagonal shape, a hexagonal shape, a heptagonal shape, and an octagonal shape in a plan view can be used, but a hexagonal shape is preferable. In the light emitting elements, all the inner angles are less than 180 degrees.

The first light emitting element has a light emission peak wavelength in 440 nm to 485 nm, preferably in 445 nm to 470 nm. The first light emitting element having such a light emission peak wavelength can realize high light emission brightness and also realize a broad range of color reproduction when constituting a display device.

The second light emitting element has a light emission peak wavelength in 495 nm to 573 nm, preferably in 520 nm to 560 nm. The first light emitting element having such a light emission peak wavelength can realize high light emission brightness and also realize a broad range of color reproduction when constituting a display device.

The third light emitting element has a light emission peak wavelength in 440 nm to 485 nm, preferably in 450 nm to 470 nm. The first light emitting element having such a light emission peak wavelength can realize high light emission brightness and also realize a broad range of color reproduction when constituting a display device. The third light emitting element may have the same wavelength as the wavelength of the first light emitting element, but may also have a different wavelength from the wavelength of the first light emitting element. For example, a wavelength that is more likely to be absorbed is confirmed from an excitation spectrum of the third fluorescent material, and the third light emitting element compatible with the wavelength can be used.

Third Fluorescent Material

The third fluorescent material absorbs light from the third light emitting element and emits light having a different wavelength. The third fluorescent material absorbs light from the third light emitting element 30 that has a light emission peak wavelength in 440 nm to 485 nm and mainly emits blue light, and emits light having a light emission peak wavelength in 584 nm to 780 nm. The third fluorescent material is not necessarily a single body but can be formed by combining a plurality of fluorescent materials.

The third fluorescent material is provided on a plane of the third light emitting element. The third fluorescent material can be fixed with use of a binder or an adhesive agent, or the fixation may be performed with use of one obtained by solidifying the third fluorescent material. Particularly, the third fluorescent material is preferably disposed densely. The third fluorescent material is preferably disposed on an entire plane of the third light emitting element, but can be disposed only on a part of the plane of the third light emitting element. For example, the third fluorescent material can be fitted into the shape of the third lens portion to have a similar shape to the shape of the third lens portion in a plan view. For example, the third fluorescent material can be formed into a circle when the shape of the third lens portion is a circle in a plan view. As described above, the shape of the third fluorescent material can be fitted into the shape of the third lens portion to easily adjust a focal point. In a case of disposing the third fluorescent material only on a part of the plane of the third light emitting element, however, a reflecting film or a light-shielding film is preferably disposed on the residual portion of the plane of the third light emitting element. The reflecting film and the light-shielding film can be provided to reduce leakage of light from the third light emitting element toward the plane.

Alternatively, the third fluorescent material can be dispersed in, for example, an adhesive agent, and disposed on the third light emitting element. In this case, the third fluorescent material may be dispersed in an adhesive agent but may also settle out on a third light emitting element side. The third fluorescent material can settle out on the third light emitting element side to densely dispose the third fluorescent material. Further, heat from the third fluorescent material can be released to a mounting substrate side via the third light emitting element.

The shape of an aggregate of the third fluorescent material is preferably any one shape fitted into the shape of the third light emitting element and selected from a pentagonal shape, a hexagonal shape, a heptagonal shape, and an octagonal shape, but can be a circle or an ellipse. When the third fluorescent material is sintered or solidified in advance, the third fluorescent material larger than the third light emitting element can also be used.

The third fluorescent material preferably has a particle size of 10 nm or more and 50 µm or less, and preferably has a particle size of 1 µm or more and 30 µm or less in view of optical characteristics and operability in manufacturing a light emitting device. Use of particles having almost the same particle size can reduce variation in color of products. In addition, large particles and small particles are mixed to reduce a gap between the particles of the third fluorescent material, so that the third fluorescent material can be more densely disposed. The third fluorescent material can be densely disposed to reduce leakage of light from the third light emitting element.

The thickness of the third fluorescent material is not particularly limited, but is preferably a thickness thick enough not to transmit most part of the light from the third light emitting element. The third fluorescent material can be densely disposed on the third light emitting element to decrease the thickness of the third fluorescent material. The thickness of the third fluorescent material is preferably about 1 µm to 500 µm, particularly preferably about 5 µm to 300 µm.

When including about 10 nm to 100 nm nanoparticles, the third fluorescent material preferably has such a film thickness as to reflect light from the third light emitting element and may have a multi-layer structure. With such a configuration, it is possible to inhibit light emitted from the third light emitting element from passing through a layer of the third fluorescent material.

Here, the thickness of the third light emitting element is made thin. The third fluorescent material disposed on the third light emitting element can be made almost as high as the first light emitting element.

When including quantum dots, the third fluorescent material can be decreased in thickness. It is possible to further reduce light leakage to the first and second light emitting elements that are adjacent to the third fluorescent material.

As the third fluorescent material, there can be used a fluorescent material represented by $CaAlSiN_3$:Eu, $(Ca,Sr)AlSiN_3$:Eu, $(Ca,Sr,Ba)_2Si_5N_8$:Eu, $Sr_2(Al,Si)_{10}(O,N)_{14}$:Eu, $(Sr,Ca)LiAl_3N_4$:Eu, $(Ca,Sr,Ba)S$:Eu, $3.5MgO.0.5MgF_2.GeO_2$:Mn, or $K_2(Si,Ti,Ge)F_6$:Mn, and one or more fluorescent materials obtained by substituting a part of these elements. Parentheses indicate that any one of the elements in the parentheses is included in the fluorescent material. As the quantum dots, there can be used InP/ZnS, CdSe/ZnCdTe, or PdS that has a particle size of 1 nm to 20 nm.

The third fluorescent material may be disposed on the third light emitting element together with a reflecting material or a light diffusing material such as silica, titanium oxide, aluminum oxide, zinc oxide, or glass.

Third Film

The third film preferably reflects or absorbs light output from the third light emitting element and the third fluorescent material.

For example, use of the third film that reflects light from the third light emitting element enables light from a side surface of the third light emitting element to be output toward a plane to increase light extraction efficiency.

On the other hand, use of the third film that absorbs light from the third light emitting element enables absorption of light, from a side surface of the third light emitting element, which is output by the third light emitting element, to prevent false lighting.

The third film is provided on a side surface of the third light emitting element and a side surface of the third fluorescent material. The third film can be fixed with use of a member containing a light reflecting member or a light absorbing member, but may be fixed with use of one obtained by solidifying a light reflecting member or a light absorbing member. Particularly, the third film is preferably disposed so as to exhibit its light reflecting function or light absorbing function. Preferably, the third film is almost entirely disposed on a side surface of the third light emitting element and a side surface of the third fluorescent material without deteriorating the light reflecting function or the light absorbing function, but the third film may also be partially disposed on a side surface of the third light emitting element and a side surface of the third fluorescent material. This is because the third fluorescent material is disposed on an upper surface of the third light emitting element and therefore, light from the first and second light emitting elements is to be prevented from directly irradiating the third fluorescent material. Irradiation of the third fluorescent material with light from the first and second light emitting elements is to be prevented because such irradiation causes false lighting. Therefore, the third film may also be formed on a side surface of the third light emitting element on a third fluorescent material side and a side surface of the third fluorescent material.

The third film may be disposed not only on a side surface of the third fluorescent material but also on a part of an upper surface of the third fluorescent material and a part of a bottom surface of the third light emitting element.

As the third film, it is possible to use one obtained by dispersing a particulate light reflecting member or light absorbing member in a resin.

As the third film, a multi-layer reflecting film can also be used. As the multi-layer reflecting film, there can be used inorganic materials such as aluminum oxide, silica, and titanium oxide, and an organic material.

The thickness of the third film is not particularly limited, but is preferably a thickness thick enough not to transmit most part of the light from the first and second light emitting elements. The thickness of the third film is preferably about 0.1 μm to 300 μm, particularly preferably about 1 μm to 100 μm.

As the third film, there can be used, for example, resins such as a thermosetting resin and a thermoplastic resin, and inorganic members such as glass and ceramics. Examples of the thermosetting resin include a silicone resin, a silicone-modified resin, a silicone hybrid resin, an epoxy resin, an epoxy-modified resin, a urea resin, a diallyl phthalate resin, a phenol resin, an unsaturated polyester resin, and a hybrid resin including at least one of these resins. Examples of the thermoplastic resin include a polycarbonate resin, an acrylic resin, a polymethyl pentene resin, a polynorbornene resin, a polyphthal amide resin, a polyester resin, a liquid crystal resin, a polyphenylene ether resin, an aromatic polyamide resin, and a hybrid resin including at least one of these resins. Especially preferable are a polyester resin such as PCT (polycyclohexylenedimethylene terephthalate), an aromatic polyamide resin, an epoxy resin, an unsaturated polyester resin, a silicone resin, and a silicone hybrid resin that are excellent in heat resistance and light resistance. Examples of the glass include low melting temperature glass and liquid glass, and examples of the ceramics include aluminum oxide, silica, and hydraulic cement.

The third film preferably contains in a resin or an inorganic member a colored pigment such as a white pigment or a black pigment. This is because although the third film can have a light reflecting function only by a difference in refractive index, use of a colored pigment allows the third film to exhibit a better light reflecting function or light absorbing function. Examples of the white pigment include oxides such as titanium oxide, alumina, silica, quartz, tin oxide, zinc oxide, tin monoxide, calcium oxide, magnesium oxide, and beryllium oxide, metal nitrides such as boron nitride, silicon nitride, and aluminum nitride, metal carbides such as SiC, metal carbonates such as calcium carbonate, potassium carbonate, sodium carbonate, magnesium carbonate, and barium carbonate, metal hydroxides such as aluminum hydroxide and magnesium hydroxide, aluminum borate, barium titanate, calcium phosphate, calcium silicate, clay, gypsum, barium sulfate, mica, diatom earth, white earth, an inorganic balloon, talc, a fluorescent substance, and a metal piece. Examples of the silica include fume silica, precipitated silica, fused silica, crystalline silica, an ultra-fine amorphous silica powder, and silicic anhydride. As the black pigment, there can be used carbon-based black pigments such as carbon black, and oxide-based black pigments such as an oxide of iron, a composite oxide of copper and chromium, and a composite oxide of copper, chromium, and zinc.

As the light reflecting member used for the third film, there can be used particles of a white pigment such as titanium oxide ($TiO_2$), zirconium oxide ($ZrO_2$), magnesium oxide (MgO), magnesium carbonate ($MgCO_3$), magnesium hydroxide ($Mg(OH)_2$), calcium carbonate ($CaCO_3$), calcium hydroxide ($Ca(OH)_2$), calcium silicate ($CaSiO_3$), zinc oxide (ZnO), barium titanate ($BaTiO_3$), or aluminum oxide ($Al_2O_3$). Especially, $TiO_2$ is preferable because it is relatively stable to, for example, moisture, has a high refractive index, and is excellent in thermal conductivity.

A material of the third film may be the same as or different from a material of the third lens, particularly the third fixing portion. A difference in refractive index is provided between the material of the third film and the material of the third fixing portion to allow the third film to have a better light reflecting function or light absorbing function.

First Lens, Second Lens, and Third Lens

The first lens includes the first lens portion disposed over the first light emitting element, and the first fixing portion. The first lens can transmit light from the first light emitting element and can also protect the first light emitting element from, for example, moisture and dust. Particularly, the first lens portion transmits necessarily 50% or more, preferably 70% or more, particularly preferably 80% or more of the light from the first light emitting element. The first fixing portion is made from the same material as a material of the first lens portion, and is preferably integrally molded with the first lens portion, but may also be separately molded. The first fixing portion may also contain a light absorbing member or a light reflecting member.

The first lens portion is preferably substantially hemispherical. Alternatively, the first lens portion may have a hollow dome shape. Further alternatively, the first lens portion may have an upper-surface-flattened hemispherical shape, a shape having a recess on a part of an upper surface, or a polyhedron having planes in combination.

The first lens portion that is substantially hemispherical preferably has a diameter the same as or longer than a diagonal line of the first light emitting element. The first lens portion having a diameter almost the same as the length of a diagonal line of the first light emitting element enables the first lens portion to be densely arranged when a plurality of light emitting devices are arranged. The diameter of the first lens portion is preferably 1.1 times to 3.0 times, particularly preferably 1.2 times to 2.0 times a diagonal line of the first light emitting element.

The height of the first lens portion is not particularly limited, but is preferably 0.5 times to 3.0 times a diagonal line of the first light emitting element. The first lens portion is appropriately designed in view of the distance to a viewer.

As the first lens portion, there can be used, in addition to a substantially hemispherical lens, a Fresnel lens. In the Fresnel lens, the thickness of the lens portion can be made thinner than in a hemispherical lens.

The first fixing portion preferably has a similar shape to the shape of the first light emitting element. That is, when the first light emitting element has a hexagonal shape, the first fixing portion also preferably has a hexagonal shape. With such a configuration, it is possible to give a constant distance between the first light emitting element and a surface of the first fixing portion. In addition, the first fixing portion is preferably disposed along the first light emitting element. In a plan view, the distance between sides of the first fixing portion that face to each other is preferably the same as or longer than the diameter of the first lens portion. The distance between sides of the first fixing portion that face to each other can be made the same as the diameter of the first lens portion to densely arrange the first lens portion when a plurality of light emitting devices are arranged. The distance between sides of the first fixing portion that face to each other is preferably 1.1 times to 3.0 times, particularly preferably 1.2 times to 2.0 times the distance between sides of the first light emitting element that face to each other. With the first fixing portion made larger than the first lens portion in a plan view, it is possible to provide a light-shielding film on the first fixing portion and reduce upward transmission of light from the first light emitting element. Further, it is also possible to prevent the first light emitting element from falling off. The first fixing portion is preferably as high as or higher than the first light emitting element. The first fixing portion can be made as high as the first light emitting element to reduce the size of the light emitting device. The first light emitting element, particularly an electrode of the first light emitting element is preferably exposed from a bottom surface of the first fixing portion.

The third fixing portion is preferably made low so as to inhibit the third fluorescent material that is adjacent to the first lens portion, from being irradiated with light reflected on an inner surface of the first lens portion. The third fixing portion can be made low so as to inhibit the third fluorescent material from being irradiated with light from the first light emitting element. For example, an upper end of the third fixing portion may be almost at the same position as an upper surface of the third fluorescent material.

As the first lens, there can be used, for example, resins such as a thermosetting resin and a thermoplastic resin, and inorganic members such as glass and ceramics. Examples of the thermosetting resin include a silicone resin, a silicone-modified resin, a silicone hybrid resin, an epoxy resin, an epoxy-modified resin, a urea resin, a diallyl phthalate resin, a phenol resin, an unsaturated polyester resin, and a hybrid resin including at least one of these resins. Examples of the thermoplastic resin include a polycarbonate resin, an acrylic resin, a polymethyl pentene resin, a polynorbornene resin, a polyphthal amide resin, a polyester resin, a liquid crystal resin, a polyphenylene ether resin, an aromatic polyamide resin, and a hybrid resin including at least one of these resins. Especially preferable are a polyester resin such as PCT (polycyclohexylenedimethylene terephthalate), an aromatic polyamide resin, an epoxy resin, an unsaturated polyester resin, a silicone resin, and a silicone hybrid resin that are excellent in heat resistance and light resistance.

Examples of the glass include BK7, borosilicate glass, low melting temperature glass, and liquid glass, and examples of the ceramics include aluminum oxide, quartz, and calcium fluoride.

The first lens may contain in a resin or an inorganic member a colored pigment such as a white pigment or a black pigment to have a predetermined function. As the colored pigment, there can be used the same material as one used for the third film. It is preferable that the first lens portion contain a small amount of a blue pigment, the second lens portion contain a small amount of a green pigment, and the third lens portion contain a small amount of a red pigment. This enables confirmation of a light emission color without lighting the light emitting element.

The first lens may also contain a light reflecting member or a light absorbing member. As the light reflecting member, there can be used those exemplified for the third film.

As described above, the first lens portion and the first fixing portion have been described with reference to the first lens, and almost the same can be applied to the second lens and the third lens unless otherwise specified.

Second Embodiment

Figure 9:
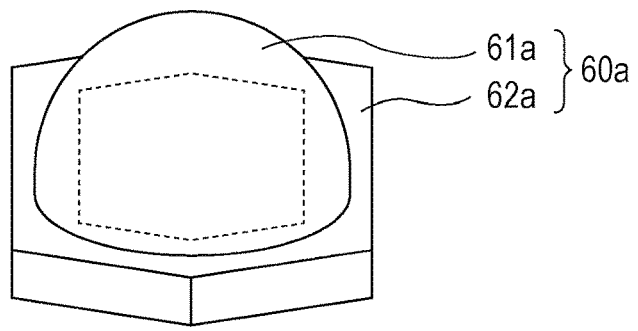
FIG. 9 is a schematic perspective view illustrating a part of a light emitting device according to a second embodiment.

A light emitting device according to a second embodiment is described. FIG. 9 is a schematic perspective view illustrating a part of the light emitting device according to the second embodiment and mainly illustrates a third lens. Description is sometimes omitted when a configuration is the same as a configuration of the light emitting device according to the first embodiment.

A third lens 60a includes a third lens portion 61a and a third fixing portion 62a. The diameter of the third lens portion 61a is shorter than the distance between sides of the third fixing portion 62a that face to each other. The third lens portion 61a can be reduced in size. In addition, the third fixing portion 62a can be enlarged to increase operability such as mounting.

While the third lens 60a have been described, the same form can apply to first and second lenses.

Third Embodiment

Figure 10:
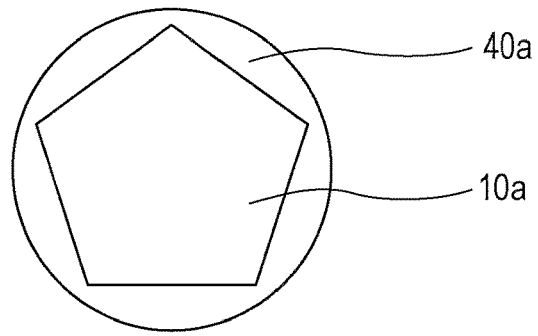
FIG. 10 is a schematic plan view illustrating a part of a light emitting device according to a third embodiment.

A light emitting device according to a third embodiment is described. FIG. 10 is a schematic plan view illustrating a part of the light emitting device according to the third embodiment and mainly illustrates a first lens. Description is omitted when a configuration is the same as the configuration of the light emitting device according to the first embodiment.

A first light emitting element 10a has a pentagonal shape in a plan view. Such a light emitting element enables use of a first lens 40a that is more compact than a lens used in a square light emitting element, so that a compact light emitting device can be manufactured.

While the first light emitting element 10a have been described, the same form can apply to second and third light emitting elements.

Fourth Embodiment

Figure 11:
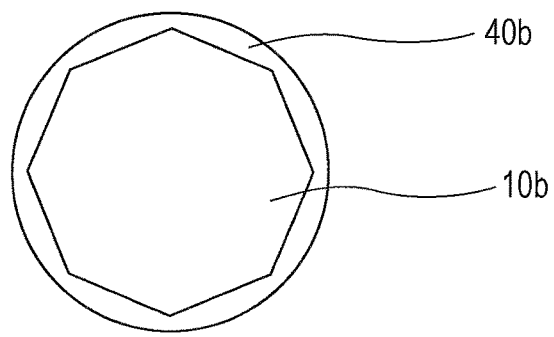
FIG. 11 is a schematic plan view illustrating a part of a light emitting device according to a fourth embodiment.

A light emitting device according to a fourth embodiment is described. FIG. 11 is a schematic plan view illustrating a part of the light emitting device according to the fourth embodiment and mainly illustrates a first lens. Description is omitted when a configuration is the same as the configuration of the light emitting device according to the first embodiment.

A first light emitting element 10b has an octagonal shape in a plan view. Such a lens enables use of a first lens 40b that is more compact than a lens used in a square light emitting element, so that a compact light emitting device can be manufactured. In addition, the first light emitting element 10b that has an octagonal shape is close to a circular shape to facilitate control of alignment. That is, the distance between the external shape of the first lens 40b and the first light emitting element 10b can be made uniform in a plan view to decrease a non-light emitting region.

While the first light emitting element 10b has been described, the same form can apply to second and third light emitting elements.

Fifth Embodiment

Figure 12:
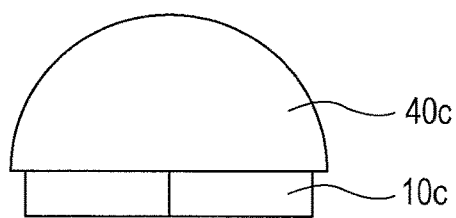
FIG. 12 is a schematic side view illustrating a part of a light emitting device according to a fifth embodiment.

A light emitting device according to a fifth embodiment is described. FIG. 12 is a schematic side view illustrating a part of the light emitting device according to the fifth embodiment and mainly illustrates a first lens. Description is omitted when a configuration is the same as the configuration of the light emitting device according to the first embodiment.

A first lens 40c is disposed over a first light emitting element 10c. A side of the first light emitting element 10c is not covered with a first fixing portion, and a first lens portion is disposed on an upper surface of the first light emitting element 10c. The first lens 40c can be fixed to the upper surface of the first light emitting element 10c directly or with use of, for example, an adhesive agent. Without using a first fixing portion, heat from the first light emitting element 10c can be efficiently released exteriorly. In addition, the center of the first light emitting element 10c is easily matched with a focal point of the first lens 40c to facilitate coincidence of optical axes.

Sixth Embodiment

Figure 13:
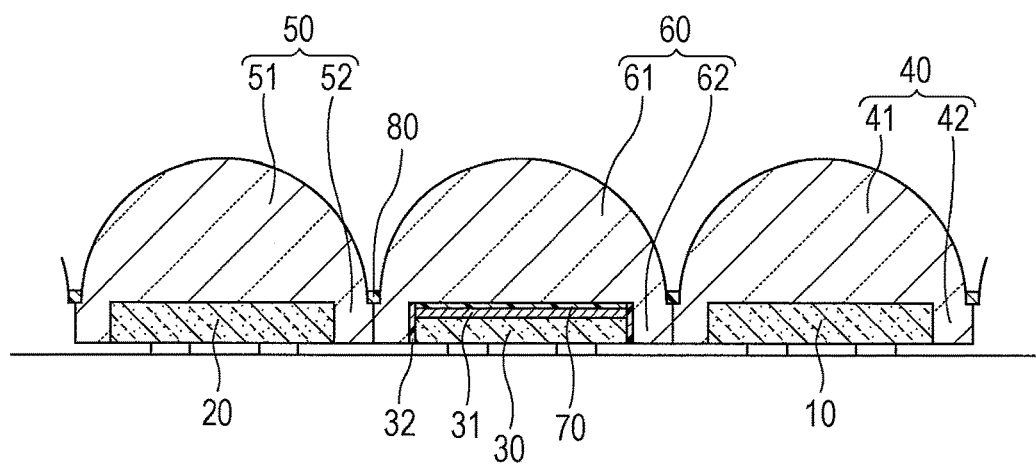
FIG. 13 is a schematic sectional view illustrating a light emitting device according to a sixth embodiment.

A light emitting device according to a sixth embodiment is described. FIG. 13 is a schematic sectional view illustrating the light emitting device according to the sixth embodiment. Description is sometimes omitted when a configuration is the same as a configuration of the light emitting device according to the first embodiment.

The light emitting device includes a first light emitting element 10, a second light emitting element 20, and a third light emitting element 30, a first lens 40, a second lens 50, and a third lens 60. The first, second, and third light emitting elements 10, 20, and 30 have each a hexagonal shape in a plan view. The first light emitting element 10 is as high as the third light emitting element 30. A third fluorescent material 31 is provided on a plane of the third light emitting element 30. With the third fluorescent material provided, an upper surface of the third fluorescent material 31 is higher than an upper surface of the first light emitting element 10. A third film 32 is provided on a side surface of the third light emitting element 30 and a side surface of the third fluorescent material. A reflecting film 70 is disposed on an upper surface of the third fluorescent material. This reflecting film 70 can be made a multi-layer film that reflects light from the third light emitting element 30 but transmits light from the third fluorescent material. The first lens 40 includes a first lens portion 41 and a first fixing portion 42. The first lens portion 41 is a substantially circular shape in a plan view, and the diameter of the first lens portion 41 is shorter than the distance between sides of the first fixing portion 42 that face to each other. A second lens portion 51 and a third lens portion 61 are the same as the first lens portion 41. The first fixing portion 42, a second fixing portion 52, and a third fixing portion 62 are densely arranged so as to be in contact with each other. As described above, the first fixing portion 42 can be brought into contact with the second fixing portion 52 to easily arrange a plurality of light emitting devices and also to arrange the first, second, and third light emitting elements 10, 20, and 30 with an equal interval among the centers of the light emitting elements and in a substantially regular triangular shape. Without covering the first, second, and third lens portions 41, 51, and 61, a light-shielding film 80 can be formed on upper surfaces of the first, second, and third fixing portions 42, 52, and 62. A display device, such as a display, in which a plurality of light emitting devices are homogeneously arranged is irradiated with external light such as sunlight to cause reflection of external light. The reflection of external light can be reduced by providing the light-shielding film 80. As the light-shielding film 80, it is preferable to use a waterproof resin containing a black pigment such as carbon black. Such a resin can fill gaps of the first, second, and third fixing portions, 42, 52, and 62.

Method for Manufacturing Light Emitting Device According to Sixth Embodiment

Figure 14:
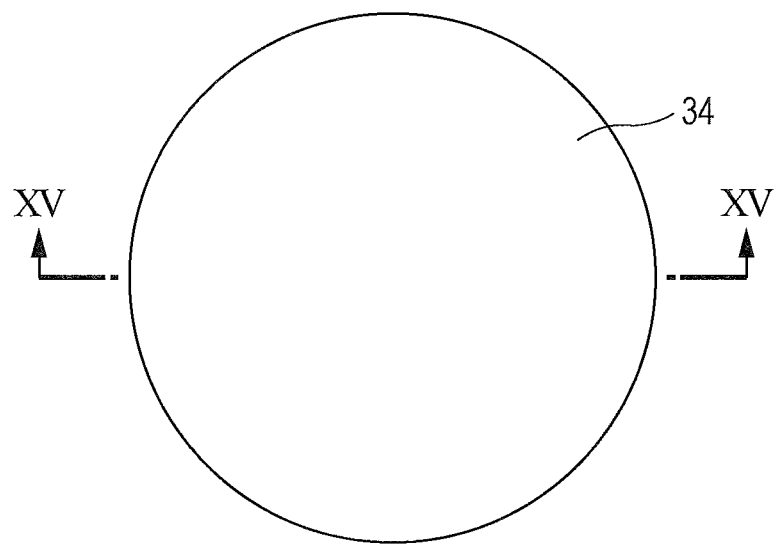
FIG. 14 is a schematic plan view illustrating one step of a method for manufacturing the light emitting device according to the sixth embodiment.
Figure 15:
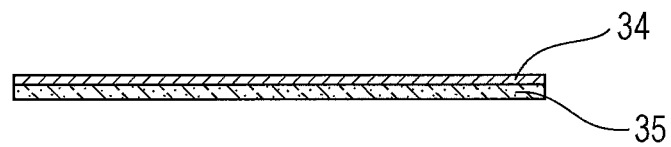
FIG. 15 is a schematic sectional view illustrating one step of the method for manufacturing the light emitting device according to the sixth embodiment.
Figure 16:
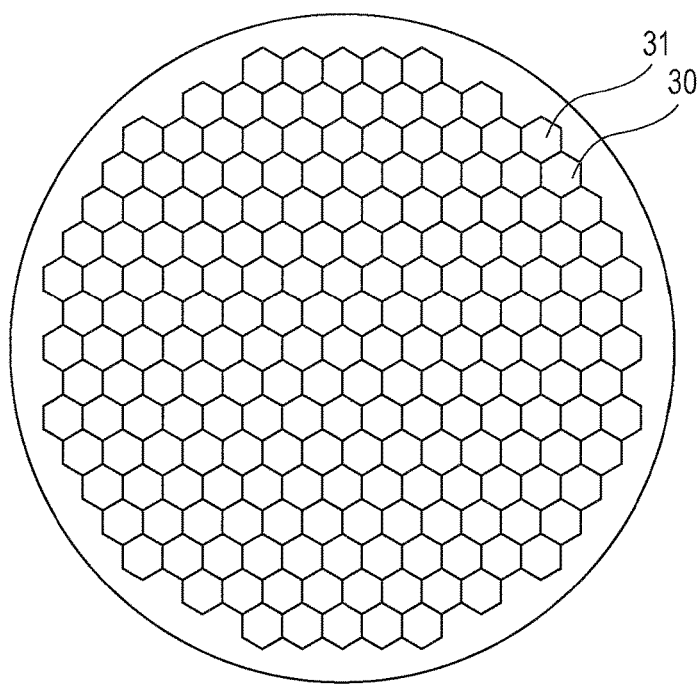
FIG. 16 is a schematic plan view illustrating one step of the method for manufacturing the light emitting device according to the sixth embodiment.
Figure 17:
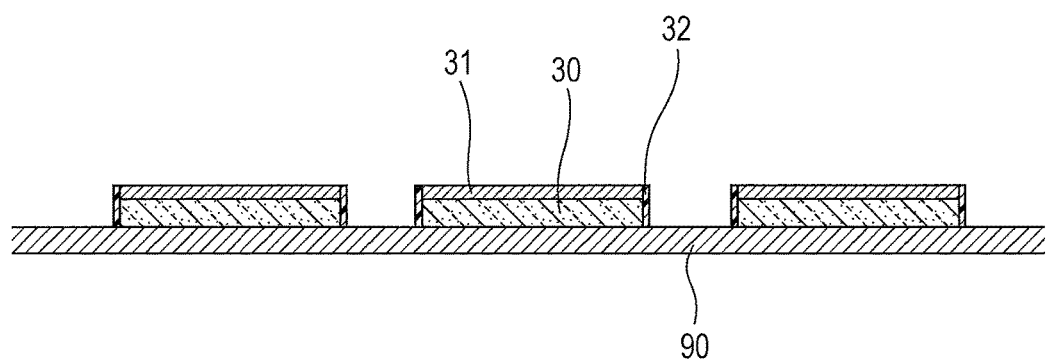
FIG. 17 is a schematic sectional view illustrating one step of the method for manufacturing the light emitting device according to the sixth embodiment.
Figure 18:
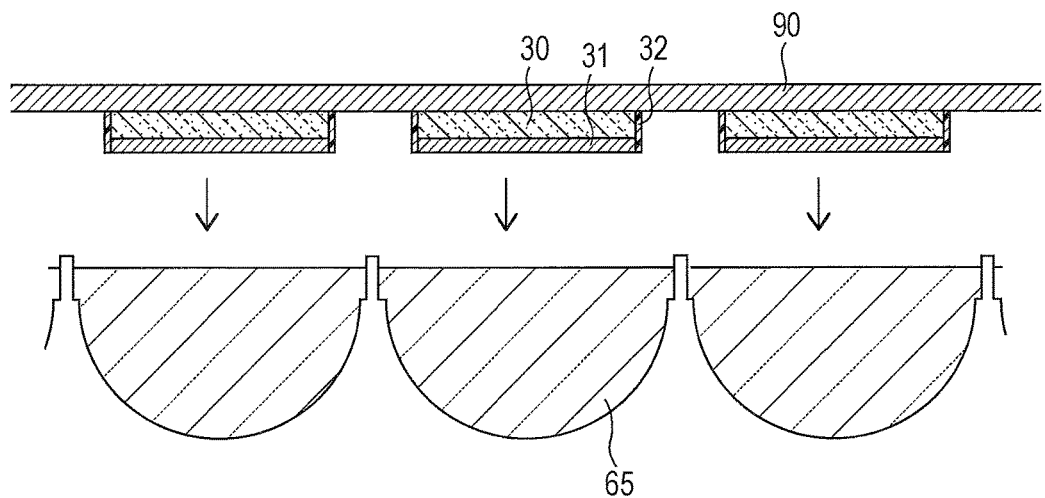
FIG. 18 is a schematic sectional view illustrating one step of the method for manufacturing the light emitting device according to the sixth embodiment.
Figure 19:
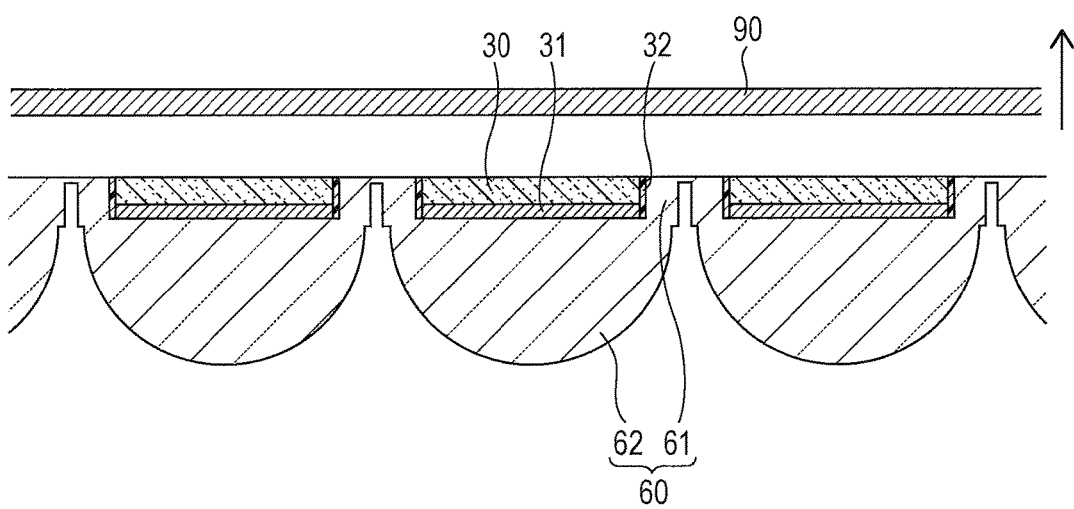
FIG. 19 is a schematic sectional view illustrating one step of the method for manufacturing the light emitting device according to the sixth embodiment.

Hereinafter, a method for manufacturing the light emitting device according to the sixth embodiment is described with reference to drawings. FIG. 14 is a schematic plan view illustrating one step of the method for manufacturing the light emitting device according to the sixth embodiment. FIG. 14 is a schematic plan view illustrating an aggregate 34 of the third fluorescent material. FIG. 15 is a schematic sectional view illustrating one step of the method for manufacturing the light emitting device according to the sixth embodiment. FIG. 15 is a schematic sectional view that illustrates a step of bonding an uncut third light emitting element 35 with the aggregate 34 of the third fluorescent material and that is taken along the line XV-XV in FIG. 14. FIG. 16 is a schematic plan view illustrating one step of the method for manufacturing the light emitting device according to the sixth embodiment. FIG. 16 is a schematic plan view illustrating a step of cutting the aggregate of the third fluorescent material into hexagonal shapes. FIG. 17 is a schematic sectional view illustrating one step of the method for manufacturing the light emitting device according to the sixth embodiment. FIG. 17 is a schematic sectional view illustrating a step of disposing the third fluorescent material and the third light emitting element on a base. FIG. 18 is a schematic sectional view illustrating one step of the method for manufacturing the light emitting device according to the sixth embodiment. FIG. 18 is a schematic sectional view illustrating a step of disposing the base on a mold and molding a third resin and the third fluorescent material. FIG. 19 is a schematic sectional view illustrating one step of the method for manufacturing the light emitting device according to the sixth embodiment. FIG. 19 is a schematic sectional view illustrating a step of removing the base from the third light emitting element.

First prepared are the uncut third light emitting element 35 and the aggregate 34 of the third fluorescent material that is provided on the uncut third light emitting element 35. The uncut third light emitting element 35 includes a substrate of, for example, sapphire and a nitride semiconductor layer provided on the substrate. The third fluorescent material is dispersed in, for example, an adhesive agent and applied onto the uncut third light emitting element 35. The adhesive agent is cured to form the aggregate 34 of the third fluorescent material on the uncut third light emitting element 35. It is possible to appropriately change the film thickness of the aggregate 34 of the third fluorescent material and the application amount of the third fluorescent material according to the type and the state of the application of the third fluorescent material.

Next, the uncut third light emitting element 35 provided with the aggregate 34 of the third fluorescent material is cut into hexagonal shapes in a plan view. For the cutting, it is preferable to use a laser dicing method capable of cutting the uncut third light emitting element in a zigzag pattern.

The laser dicing method is a technique of irradiating a substrate with laser light, preferably femtosecond-pulse laser light in such a manner as to collect the light in an internal portion of the substrate, so that the substrate at a portion near a focal point is modified to form a cutting groove. The substrate can be irradiated with laser light along a boundary to form a zigzag-shaped cutting groove inside the substrate. Subsequently, stress can be applied to the substrate with use of, for example, a roller, to separate a wafer into pieces with the cutting groove formed along the boundary as a starting point.

The technique of cutting a wafer into a non-rectangular shape by the laser dicing method is described in detail in, for example, Japanese Unexamined Patent Application Publication No. 2006-135309, and therefore further description on the technique is omitted.

Next, the third film 32 is provided on a side surface of the third light emitting element 30 and a side surface of the third fluorescent material 31. Third light emitting elements 30 are arranged on, for example, a base 90, with a predetermined interval. Then, an upper surface of the third fluorescent material 31 is masked, and the third film 32 is formed on the side surface of the third light emitting element 30 and the side surface of the third fluorescent material 31 by, for example, spray coating, ink jet coating, jet dispenser coating, or print coating. Subsequently, the upper surface of the third fluorescent material 31 is unmasked. The unmasking can be performed after thermal curing by an oven or temporary curing by irradiation with light such as UV light or laser light in order to maintain the shape of the material applied.

Next, the reflecting film 70 can also be provided on an upper surface of the third fluorescent material 31. The reflecting film 70 may be provided in advance on the third fluorescent material 31 before the third film 32 is provided.

Next, an unmolded third resin 65 is injected into the mold having a recess portion. The mold includes a hemispherical recess to mold the unmolded third resin into a shape of the third lens 60. The unmolded third resin 65 is injected into the mold.

The amount of the unmolded third resin 65 to be injected into the mold is decreased in view of the size of the third light emitting element 30. The third fluorescent material 31 and third film 32—equipped third light emitting element 30 that is provided on the base 90 is disposed in the mold. The unmolded third resin 65 penetrates into, for example, a space among the third light emitting element 30, the third fluorescent material 31, and the third film 32. Subsequently, heat having a predetermined temperature is applied to the mold to temporarily cure the unmolded third resin 65.

Last, the base 90 is removed from the third light emitting element 30.

Subsequently, the third light emitting element 30 is taken out of the mold and heat having a predetermined temperature is applied to the unmolded third resin 65 for final curing. Before the base 90 is removed from the third light emitting element 30, however, the third light emitting element 30 may be taken out of the mold, heat having a predetermined temperature may be applied to the unmolded third resin 65 for final curing, and subsequently, the base 90 may be removed from the third light emitting element 30. The unmolded third resin 65 can be finally cured to form the third lens 60 that includes the third lens portion 61 and the third fixing portion 62.

The first and second light emitting elements can be molded in almost the same manner as the third light emitting element.

Thus, the light emitting device can be easily manufactured.

Seventh Embodiment

Figure 20:
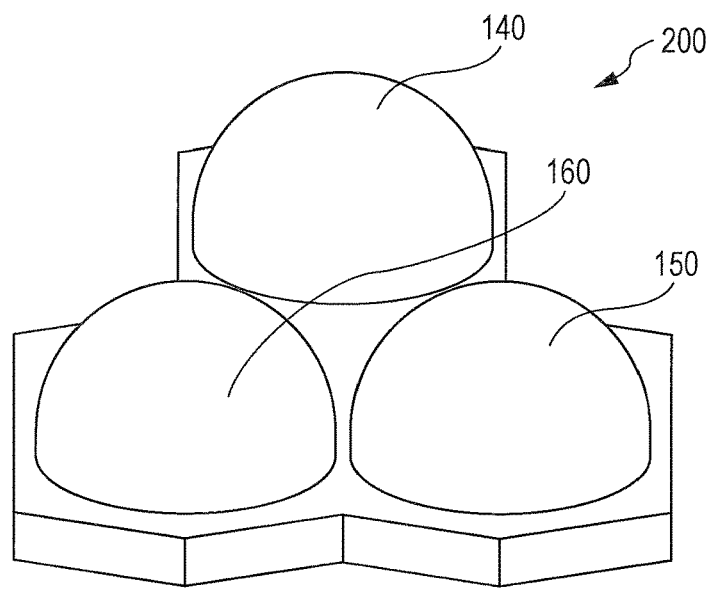
FIG. 20 is a schematic perspective view illustrating a light emitting device according to a seventh embodiment.
Figure 21:
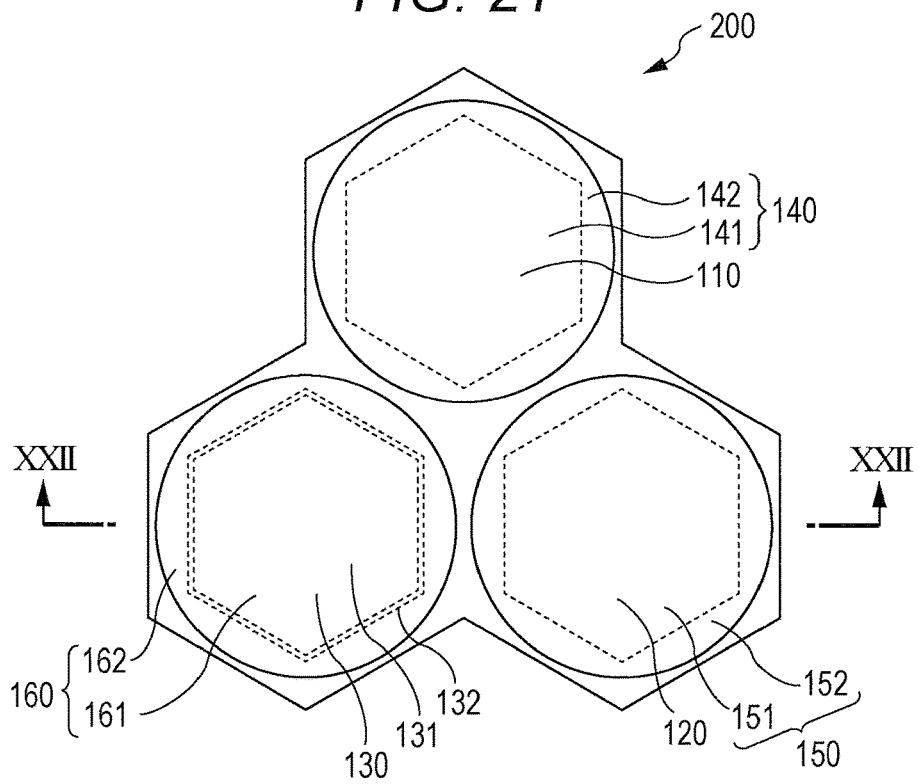
FIG. 21 is a schematic plan view illustrating the light emitting device according to the seventh embodiment.
Figure 22:
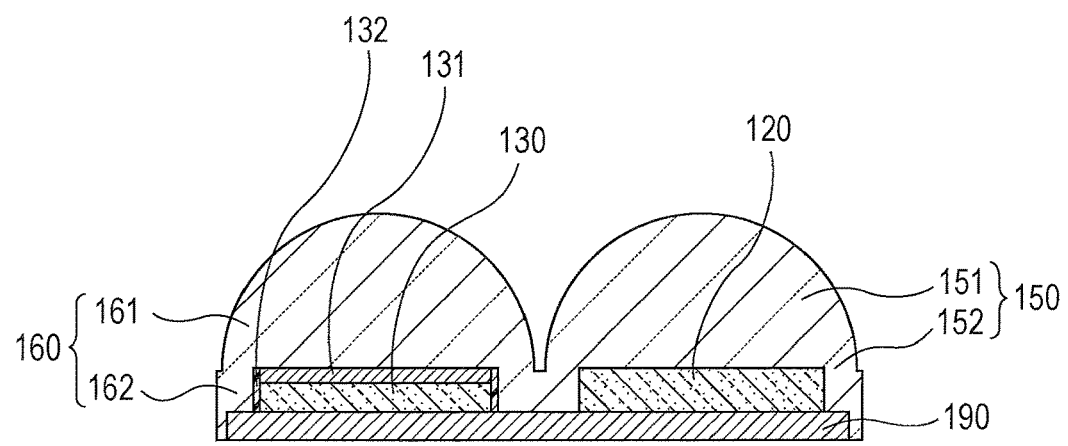
FIG. 22 is a schematic sectional view illustrating the light emitting device according to the seventh embodiment.
Figure 23:
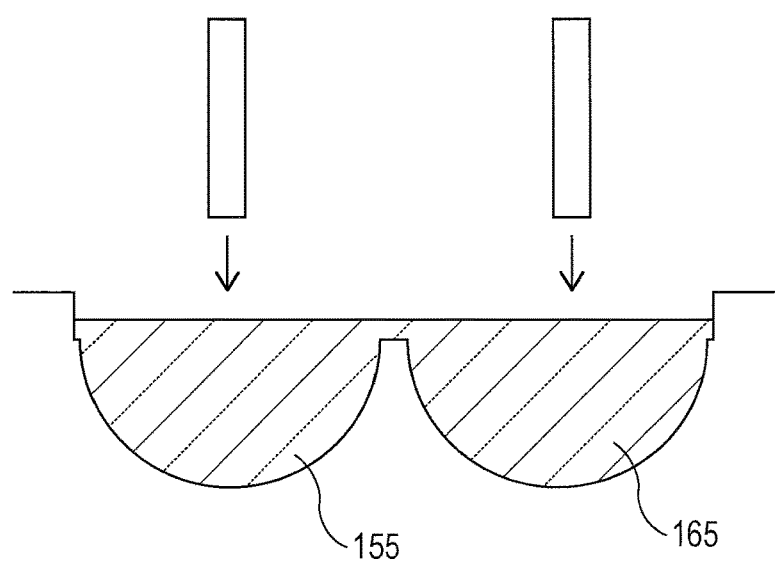
FIG. 23 is a schematic sectional view illustrating one step of a method for manufacturing the light emitting device according to the seventh embodiment.
Figure 24:
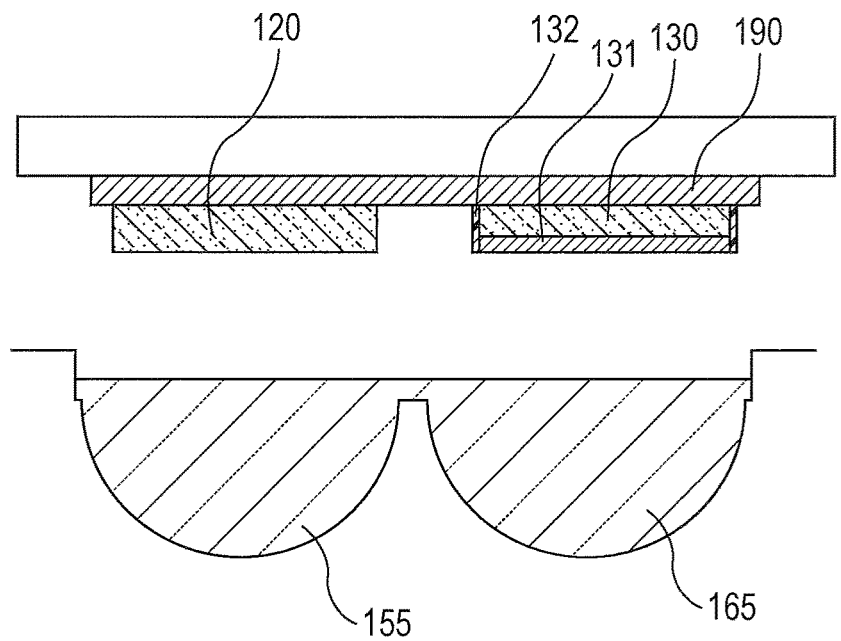
FIG. 24 is a schematic sectional view illustrating one step of the method for manufacturing the light emitting device according to the seventh embodiment.
Figure 25:
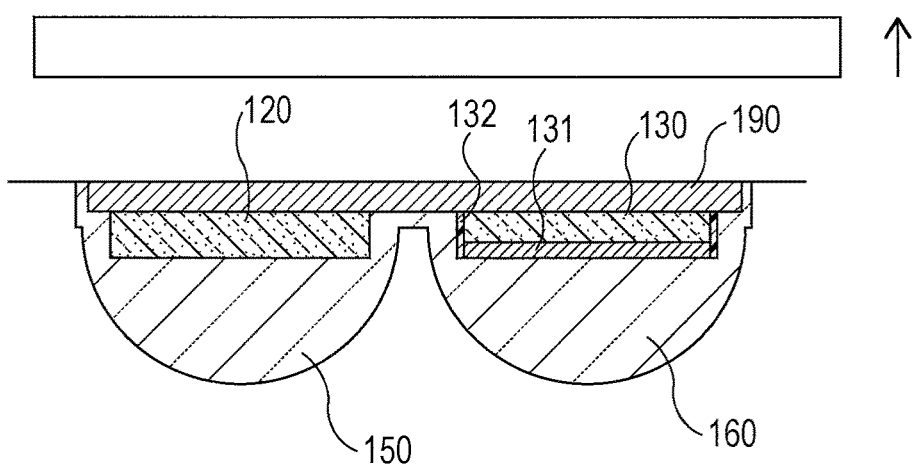
FIG. 25 is a schematic sectional view illustrating one step of the method for manufacturing the light emitting device according to the seventh embodiment.
Figure 26:
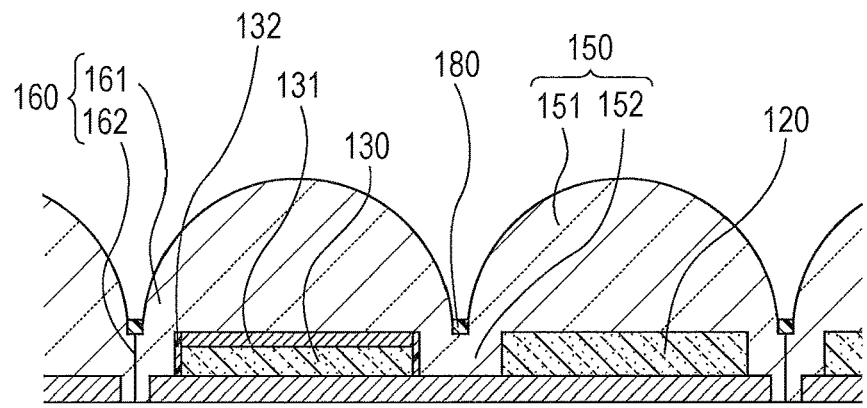
FIG. 26 is a schematic sectional view illustrating a display device including a plurality of light emitting devices according to the seventh embodiment.

A light emitting device according to a seventh embodiment is described. FIG. 20 is a schematic perspective view illustrating the light emitting device according to the seventh embodiment. FIG. 21 is a schematic plan view illustrating the light emitting device according to the seventh embodiment. FIG. 22 is a schematic sectional view that illustrates the light emitting device according to the seventh embodiment and is taken along the line XXII-XXII in FIG. 21. FIGS. 23 to 25 are schematic sectional views each illustrating one step of the method for manufacturing the light emitting device according to the seventh embodiment. FIG. 23 is a schematic sectional view illustrating a step of filling a mold with an unmolded second resin and an unmolded third resin. FIG. 24 is a schematic sectional view illustrating a step of disposing a base in the mold. FIG. 25 is a schematic sectional view illustrating a step of peeling a board from the base. FIG. 26 is a schematic sectional view illustrating a display device including a plurality of the light emitting devices according to the seventh embodiment. Description is sometimes omitted when a configuration is the same as a configuration of the light emitting device according to the first embodiment.

A light emitting device 200 includes at least a first light emitting element 110, a second light emitting element 120, and a third light emitting element 130. The first light emitting element 110 faiths a hexagonal shape in a plan view, has a light emission peak wavelength in 440 nm to 485 nm, and mainly emits blue light. The second light emitting element 120 forms a hexagonal shape in a plan view, has a light emission peak wavelength in 495 nm to 573 nm, and mainly emits green light. The third light emitting element 130 forms a hexagonal shape in a plan view, has a light emission peak wavelength in 440 nm to 485 nm, and mainly emits blue light. A third fluorescent material 131 is provided on a plane of the third light emitting element 130. A third film 132 is provided on a side surface of the third light emitting element 130 and a side surface of the third fluorescent material 131. A first lens 140 including at least a first lens portion 141 is disposed over the first light emitting element 110. A second lens 150 including at least a second lens portion 151 is disposed over the second light emitting element 120. A third lens 160 including at least a third lens portion 161 is disposed over the third light emitting element 130. The first lens portion 141 contains a blue pigment, the second lens portion 151 contains a green pigment, and the third lens portion 161 contains a red pigment. Such configurations can provide the light emitting device 200 that is compact.

A light-shielding film 180 is provided on upper surfaces of a first fixing portion 142, a second fixing portion 152, and a third fixing portion 162. The light-shielding film 180 does not cover the first, second, and third lens portions 141, 151, and 161 but covers the upper surfaces of the first, second, and third fixing portions 142, 152, and 162.

The light emitting device according to the first embodiment has the first, second, and third fixing portions that are separate from each other, whereas the light emitting device 200 according to the seventh embodiment has the first, second, and third fixing portions 142, 152, and 162 that are continuous. As described above, the first, second, and third fixing portions 142, 152, and 162 are integrated to give the light emitting device stability and allow the light emitting device to be easily mounted. In addition, the size of the light emitting device 200 per piece is large to facilitate handling of the light emitting device.

The first light emitting element 110 has a hexagonal shape and four sides of the first fixing portion 142 are substantially parallel with the hexagonal shape. In the same manner, the second light emitting element 120 has a hexagonal shape and four sides of the second fixing portion 152 are substantially parallel with the hexagonal shape, and the third light emitting element 130 has a hexagonal shape and four sides of the third fixing portion 162 are substantially parallel with the hexagonal shape. As described above, four sides of the first fixing portion 142 can be made substantially parallel with four sides of the first light emitting element 110 to realize reduction in size. In addition, breakage due to expansion and contraction of the first fixing portion 142 can be reduced.

In addition, the first, second, and third fixing portions 142, 152, and 162 are, in a plan view, formed surrounding the first, second, and third lens portions 141, 151, and 161, respectively to facilitate formation of the light-shielding film 180.

Further, the first, second, and third fixing portions 142, 152, and 162 are extended in three directions from the center of the light emitting device 200 while having an angle of 120 degrees from each other to facilitate combination of a plurality of the light emitting devices 200.

The first, second, and third light emitting elements 110, 120, and 130 are mounted on a base 190. The light emitting device 200 includes the base 190. As described above, the base 190 is used as a mounting substrate, making it unnecessary to separately mount each light emitting element, so that operation efficiency can be improved. A plurality of the bases 190 are arranged on a predetermined board. The plurality of the bases 190 are arranged on the predetermined board to allow the first, second, and third fixing portions 142, 152, and 162 to cover side surfaces of the bases 190, so that, for example, oxidation of wiring on the surfaces of the bases 190 and ingress of moisture can be prevented.

For the light emitting device 200, an unmolded first resin, an unmolded second resin 155, and an unmolded third resin 165 are injected into molds. The unmolded first resin that contains a blue pigment is injected into a mold corresponding to the first lens portion 141. The unmolded second resin 155 that contains a green pigment is injected into a mold corresponding to the second lens portion 151. The unmolded third resin 165 that contains a red pigment is injected into a mold corresponding to the third lens portion 161. In this procedure, the unmolded third resin 165 sometimes flows to a part corresponding to the second fixing portion 152. Mixture of the unmolded second resin 155 with the unmolded third resin 165, however, does not affect the light emission colors of the second and third light emitting elements 120 and 130. Mixture of the blue, green, and red pigments rather gives a hue close to black to reduce reflection of external light. The relationships between the unmolded first resin and the unmold second resin 155 and the relationship between the unmolded first resin and the unmolded third resin 165 are the same as the relationship between the unmolded second resin 155 and the unmolded third resin 165.

The base 190 having the first, second, and third light emitting elements 110, 120, and 130 mounted thereon is disposed in the molds, and the first, second, and third resins are cured to mold the first, second, and third lenses 140, 150, and 160.

After the first, second, and third lenses 140, 150, and 160 are molded, the base 190 is taken out of the molds to provide the light emitting device 200.

Next, a plurality of the light emitting devices 200 are densely arranged. Without covering the first, second, and third lens portions 141, 151, and 161, the light-shielding film 180 is provided on the first, second, and third fixing portions 142, 152, and 162. For the light-shielding film 180, there can be used, for example, potting, spray coating, ink jet coating, jet dispenser coating, and print coating.

Eighth Embodiment

Figure 27:
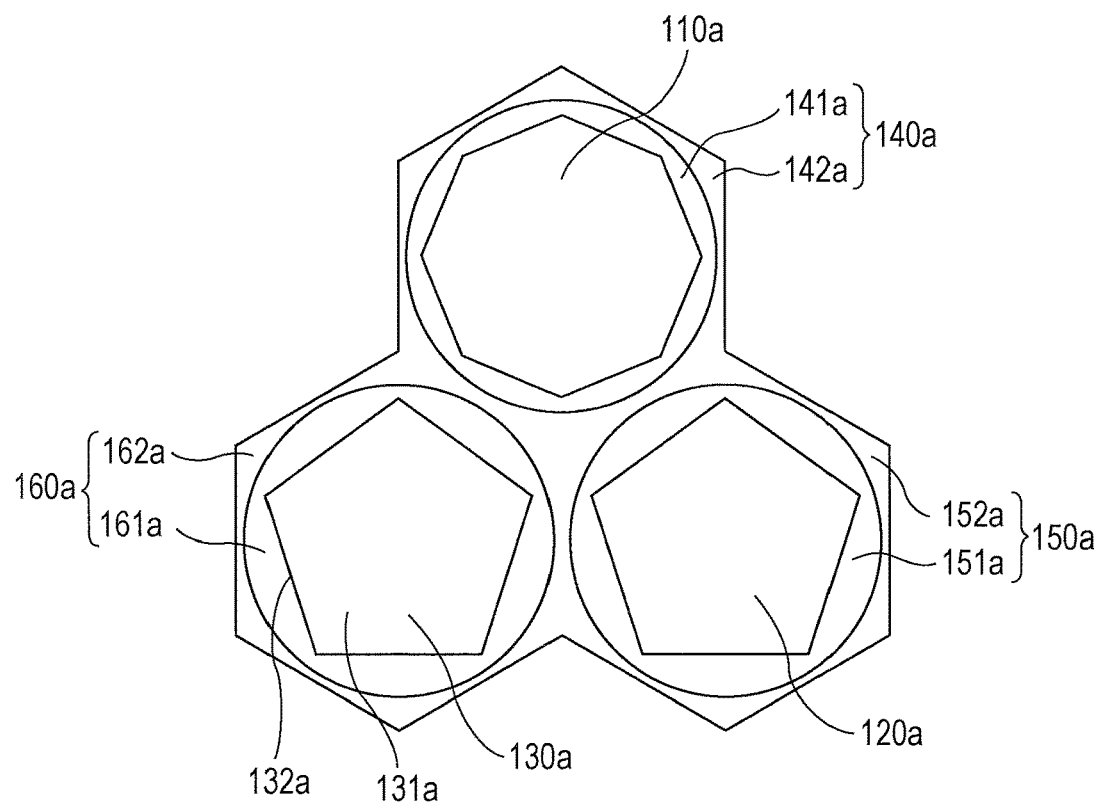
FIG. 27 is a schematic plan view illustrating a light emitting device according to an eighth embodiment.

A light emitting device according to an eighth embodiment is described. FIG. 27 is a schematic plan view illustrating the light emitting device according to the eighth embodiment. Description is sometimes omitted when a configuration is the same as a configuration of the light emitting device according to the first embodiment.

A first light emitting element 110a has a regular octagonal shape, a second light emitting element 120a has a regular pentagonal shape, and a third light emitting element 130a also has a regular pentagonal shape. The first, second, and third light emitting elements 110a, 120a, and 130a that are adjacent to each other do not face to each other in parallel. Such an arrangement can reduce the quantity of light absorbed by an adjacent light emitting element to improve light extraction efficiency of a light emitting element. A first fixing portion 142a, a second fixing portion 152a, and a third fixing portion 162a are continuous, so that, for example, light output from the first light emitting element 110a irradiates the second and third light emitting elements 120a and 130a. In this irradiation, when one surface of the first light emitting element 110a is parallel with one surface of the second light emitting element 120a, the light from the first light emitting element 110a is likely to be absorbed by the second light emitting element 120a to decrease light extraction from the first light emitting element 110a. In addition, the light from the first light emitting element 110a that has been absorbed by the second light emitting element 120a is converted to heat to increase generation of heat from the second light emitting element 120a, possibly shortening the life of the second light emitting element 120a. Therefore, the first, second, and third light emitting elements 110a, 120a, and 130a are arranged so as not to be in parallel with each other, so that the light extraction efficiency of the light emitting elements can be improved.

Ninth Embodiment

Figure 28:
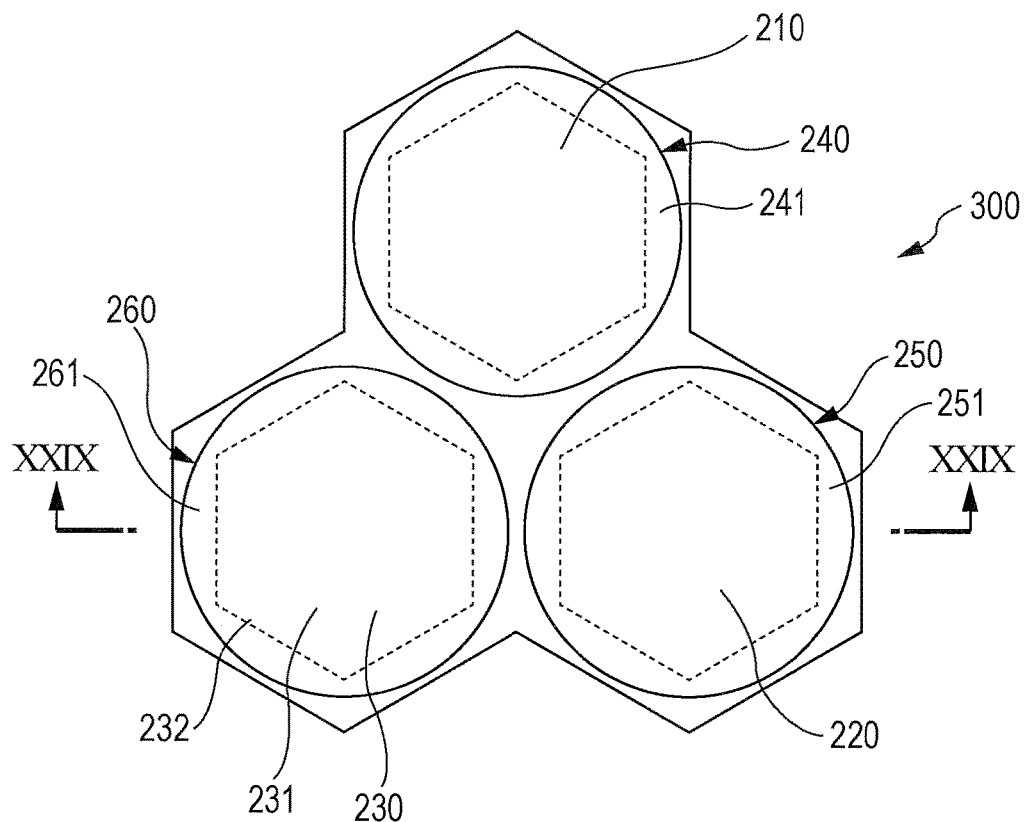
FIG. 28 is a schematic plan view illustrating a light emitting device according to a ninth embodiment.
Figure 29:
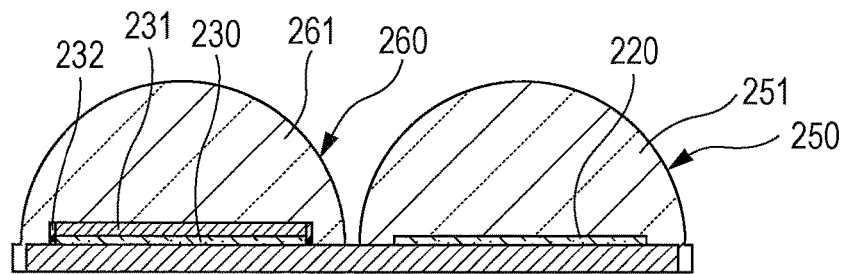
FIG. 29 is a schematic sectional view illustrating the light emitting device according to the ninth embodiment.
Figure 30:
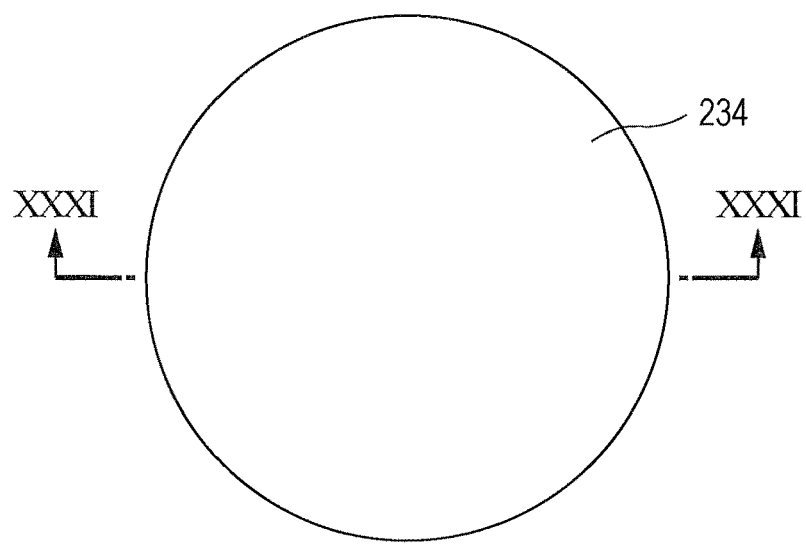
FIG. 30 illustrates one step of a method for manufacturing the light emitting device according to the ninth embodiment.
Figure 31:
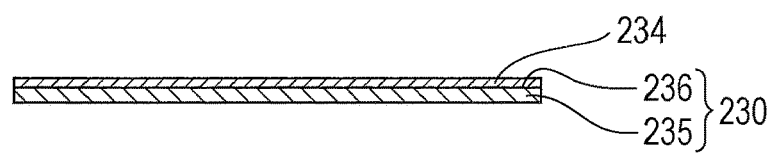
FIG. 31 illustrates one step of the method for manufacturing the light emitting device according to the ninth embodiment.
Figure 32:
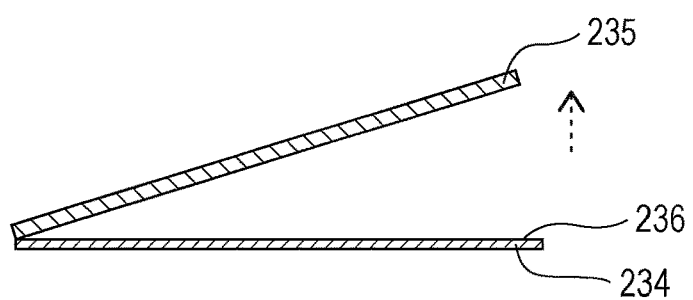
FIG. 32 illustrates one step of the method for manufacturing the light emitting device according to the ninth embodiment.
Figure 33:
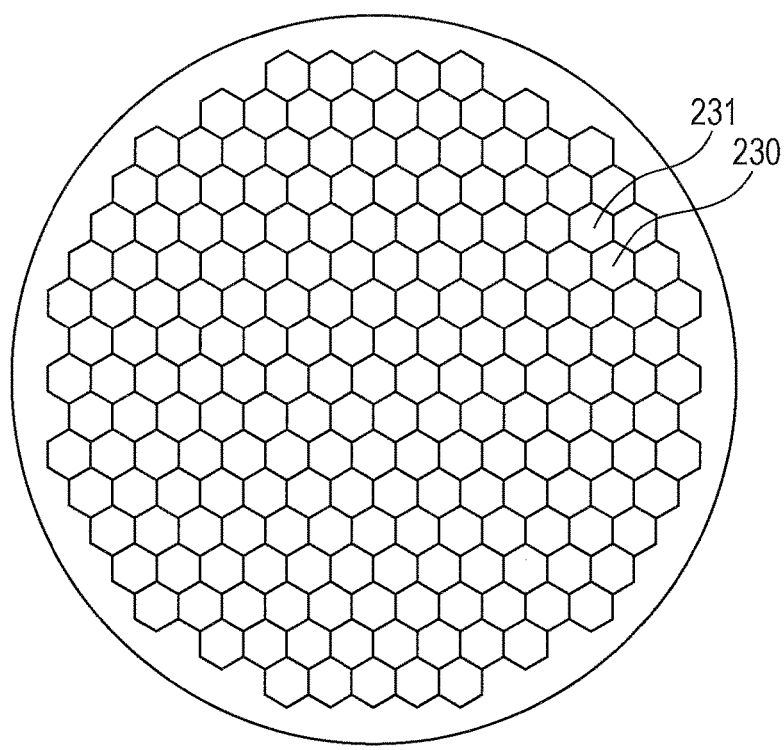
FIG. 33 illustrates one step of the method for manufacturing the light emitting device according to the ninth embodiment.

A light emitting device according to a ninth embodiment is described. FIG. 28 is a schematic plan view illustrating the light emitting device according to the ninth embodiment. FIG. 29 is a schematic sectional view that illustrates the light emitting device according to the ninth embodiment and is taken along the line XXIX-XXIX in FIG. 28. FIGS. 30 to 36 each illustrates one step of a method for manufacturing the light emitting device according to the ninth embodiment. FIG. 30 is a schematic plan view illustrating an aggregate of a third fluorescent material. FIG. 31 is a schematic sectional view illustrating a step of bonding a third growth substrate-equipped third light emitting element with the aggregate of the third fluorescent material. FIG. 32 is a schematic sectional view illustrating a step of peeling the third growth substrate from the third light emitting element. FIG. 33 is a schematic plan view illustrating a step of cutting the aggregate of the third fluorescent material into hexagonal shapes.

Figure 34:
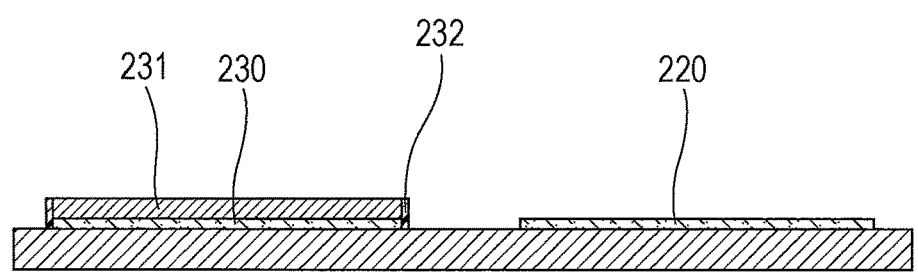
FIG. 34 illustrates one step of the method for manufacturing the light emitting device according to the ninth embodiment.
Figure 35:
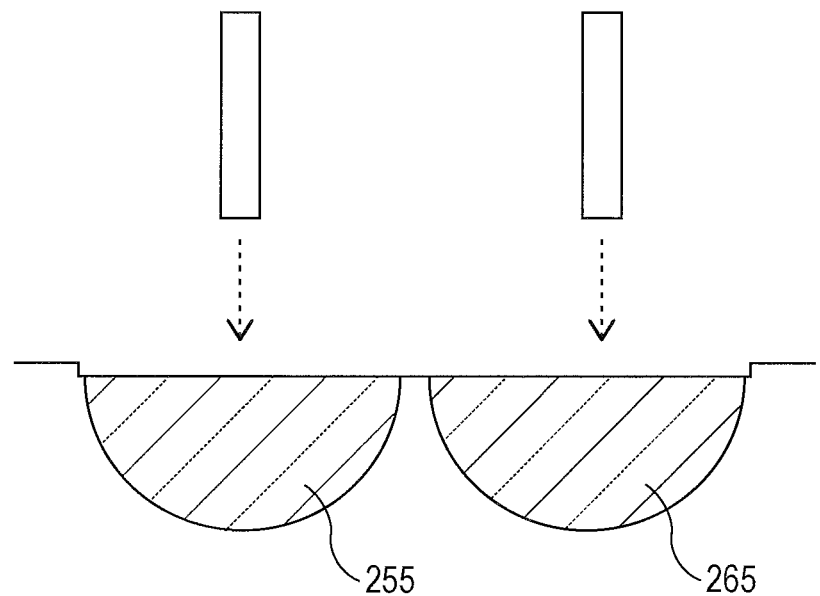
FIG. 35 illustrates one step of the method for manufacturing the light emitting device according to the ninth embodiment.
Figure 36:
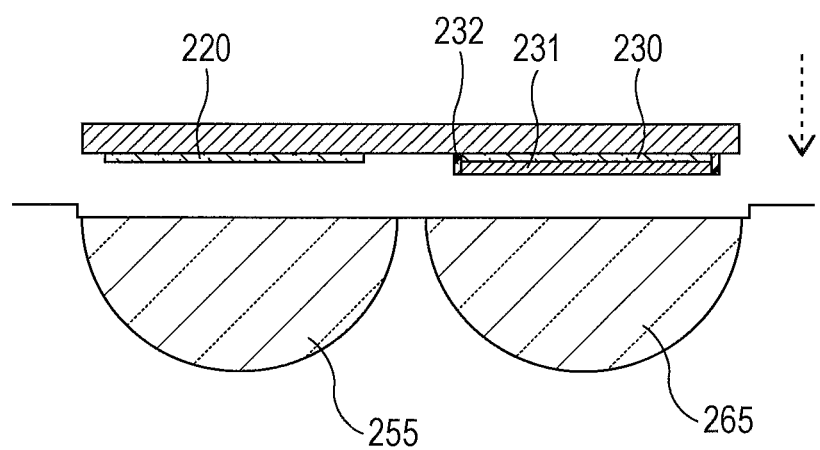
FIG. 36 illustrates one step of the method for manufacturing the light emitting device according to the ninth embodiment.

FIG. 34 is a schematic sectional view illustrating a step of mounting the third fluorescent material and the third light emitting element on a mounting substrate. FIG. 35 is a schematic sectional view illustrating a step of filling a mold with an unmolded second resin and an unmolded third resin. FIG. 36 is a schematic sectional view illustrating a step of disposing the mounting substrate on the mold and molding the third resin and the third fluorescent material. Description is sometimes omitted when a configuration is the same as a configuration of the light emitting device according to the first embodiment.

A light emitting device 300 includes at least a first light emitting element 210, a second light emitting element 220, and a third light emitting element 230. The first, second, and third light emitting elements 210, 220, and 230 each include a nitride semiconductor layer but do not include a growth substrate of, for example, sapphire. The first light emitting element 210 forms a hexagonal shape in a plan view, has a light emission peak wavelength in 440 nm to 485 nm, and mainly emits blue light. The second light emitting element 220 forms a hexagonal shape in a plan view, has a light emission peak wavelength in 495 nm to 573 nm, and mainly emits green light. The third light emitting element 230 forms a hexagonal shape in a plan view, has a light emission peak wavelength in 440 nm to 485 nm, and mainly emits blue light. A third fluorescent material 231 is provided on a plane of the third light emitting element 230. A third film 232 is provided on a side surface of the third light emitting element 230 and a side surface of the third fluorescent material 231. A first lens 240 including at least a first lens portion 241 is disposed over the first light emitting element 210. A second lens 250 including at least a second lens portion 251 is disposed over the second light emitting element 220. A third lens 260 including at least a third lens portion 261 is disposed over the third light emitting element 230. The first lens portion 241 contains a blue pigment, the second lens portion 251 contains a green pigment, and the third lens portion 261 contains a red pigment. Such configurations can provide the light emitting device 300 that is compact. In addition, none of the first, second, and third light emitting elements 210, 220, and 230 includes a growth substrate to be made thin. Further, brightness toward an upper surface can be increased and light leakage to a side surface can be reduced to enhance directivity of light in a light emission direction, so that luminance can also be improved.

The light emitting device 300 can be manufactured as follows.

First prepared is an unmounted first light emitting element including a first growth substrate of, for example, sapphire and a nitride semiconductor layer stacked on the first growth substrate. Further prepared is an unmounted second light emitting element including a second growth substrate of, for example, sapphire and a nitride semiconductor layer stacked on the second growth substrate. Furthermore, prepared is an unmounted third light emitting element including a third growth substrate 235 of, for example, sapphire and a nitride semiconductor layer 236 stacked on the third growth substrate. The unmounted first, second, and third light emitting elements may be hexagonal pieces or may also be thin plates that are to be separated into pieces. Further, an aggregate 234 of a third fluorescent material is prepared. As the aggregate 234 of the third fluorescent material, there can be used, for example, one obtained by sintering the third fluorescent material that is particulate, and one obtained by curing with, for example, a binder the third fluorescent material that is particulate. As the aggregate 234 of the third fluorescent material, a thin plate can be used. Hereinafter, the same step can be employed for the first and second light emitting elements, and therefore description of the second light emitting element is omitted.

The third light emitting element 230 to be mounted, on a nitride semiconductor layer 236 side thereof, is bonded with the aggregate 234 of the third fluorescent material. For the bonding, an adhesive agent such as an epoxy resin or a silicone resin is used.

Next, the third light emitting element 230 is irradiated with a laser while the nitride semiconductor layer 236 of the third light emitting element is kept bonded with the aggregate 234 of the third fluorescent material, to peel the third growth substrate 235 from the nitride semiconductor layer 236.

In the same manner, the first light emitting element is bonded with a first bonding substrate, and then the first growth substrate is peeled from the first light emitting element.

Next, the aggregate 234 of the third fluorescent material that is a thin plate is cut into hexagonal shapes in a plan view. The cutting is preferably performed by a laser dicing method; however, for example, a die or a dicer may be used for the cutting.

In the same manner, the first light emitting element having the first growth substrate peeled therefrom is cut into hexagonal shapes in a plan view.

The third film 232 is provided on a side surface of the third light emitting element 230. The third film 232 contains 10 nm to 100 nm nanoparticles. Use of the nanoparticles allows the third film 232 to be thinly provided.

The first, second, and third light emitting elements 210, 220, and 230 are mounted on a mounting substrate. The first, second, and third light emitting elements 210, 220, and 230 are mounted so that the centers of the light emitting elements form a regular triangular shape. The first, second, and third light emitting elements 210, 220, and 230 are each a hexagonal shape in a plan view to be densely mounted with a predetermined interval.

Next, molds are prepared that have recess portions corresponding to the first, second, and third lenses 240, 250, and 260 to mold the first, second, and third lenses, respectively and an unmolded first resin, an unmolded second resin 255, and an unmolded third resin 265 are poured into the recess portions. The unmolded first resin contains a blue pigment, the unmolded second resin 255 contains a green pigment, and the unmolded third resin 265 contains a red pigment.

Next, the mounting plate having the third light emitting element 230 and the like mounted thereon is disposed in the mold filled with the unmolded third resin 265. In the same manner, the first light emitting element 210 and the second light emitting element 220 are respectively disposed in the molds filled with the unmolded first resin and the unmolded second resin 255.

These unmolded first resin and second and third resins 255 and 265 are thermally cured by an oven or the like. It is preferable that the unmolded first resin and the like be subjected to temporary curing in the mold, taken out of the mold, and subjected to final curing.

Thus, the light emitting device can be manufactured that is compact and thin.

As described above, the light emitting device according to the subject matter of the present invention has been specifically described by way of the embodiments for carrying out the invention. The subject matter of the present invention is, however, not to be limited to these descriptions but is to be widely interpreted on the basis of the description of claims. It is needless to say that various changes and modifications based on these descriptions are included in the subject matter of the present invention.

Light emitting devices according to embodiments of the present disclosure can be used as various light sources of, for example, a backlight light source of a liquid crystal display, various lamps, a large display, and various display devices of, for example, advertisement and a destination guide, and further image reading devices such as a digital video camera, a facsimile, a copy machine, and a scanner, and a projector.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a first light emitting element to emit from a first front surface a first light having a peak wavelength in a range from 440 nm to 485 nm, the first front surface having a polygonal shape with five or more sides and being substantially perpendicular to a front-rear direction of the light emitting device;
   a second light emitting element to emit from a second front surface a second light having a peak wavelength in a range from 495 nm to 573 nm, the second front surface having a polygonal shape with five or more sides and being substantially perpendicular to the front-rear direction;
   a third light emitting element including a third front surface, a bottom surface opposite to the third front surface in the front-rear direction, and a side surface connecting the third front surface and the bottom surface, the third light emitting element being configured to emit from the third front surface a third light having a peak wavelength in a range from 440 nm to 485 nm, the third front surface having a polygonal shape with five or more sides and being substantially perpendicular to the front-rear direction;
   a fluorescent material provided on the third front surface of the third light emitting element and having a fluorescent side surface extending along the front-rear direction;
   a film provided to surround the side surface of the third light emitting element and the fluorescent side surface of the fluorescent material;
   a first lens provided over the first front surface of the first light emitting element;
   a second lens provided over the second front surface of the second light emitting element; and
   a third lens provided over the third front surface of the third light emitting element, the film being provided between the third light emitting element and the third lens.

2. The light emitting device according to claim 1, wherein the first front surface has a shape selected from a pentagonal shape, a hexagonal shape, a heptagonal shape, and an octagonal shape,
   wherein the second front surface has a shape selected from a pentagonal shape, a hexagonal shape, a heptagonal shape, and an octagonal shape, and
   wherein the third front surface has a shape selected from a pentagonal shape, a hexagonal shape, a heptagonal shape, and an octagonal shape.

3. The light emitting device according to claim 1, wherein the first lens includes a first lens portion provided on the first front surface,
   wherein the second lens includes a second lens portion provided on the second front surface, and
   wherein the third lens includes a third lens portion provided on the third front surface.

4. The light emitting device according to claim 1, wherein the first light emitting element, the second light emitting element, and the third light emitting element are arranged in a substantially triangular shape.

5. The light emitting device according to claim 1, wherein the first light emitting element, the second light emitting element, and the third light emitting element are arranged in a substantially regular triangular shape.

6. The light emitting device according to claim 1, wherein each of the first front surface, the second front surface, and the third front surface has a substantially regular hexagonal shape.

7. The light emitting device according to claim 1,
   wherein one side of the first light emitting element is substantially parallel with one side of the second light emitting element,
   wherein one side of the second light emitting element is substantially parallel with one side of the third light emitting element, and
   wherein one side of the third light emitting element is substantially parallel with one side of the first light emitting element.

8. The light emitting device according to claim 3, wherein each of the first lens portion, the second lens portion, and the third lens portion includes a substantially hemispherical part.

9. The light emitting device according to claim 3, wherein the first lens includes a first fixing portion connected to the first lens portion to cover at least a side surface of the first light emitting element.

10. The light emitting device according to claim 1, wherein the first fixing portion has a similar shape to a shape of the first front surface.

11. The light emitting device according to a claim 1,
    wherein the first light emitting element has a shape of a substantially hexagonal column,
    wherein the first fixing portion has a shape of a substantially hexagonal column,
    wherein the first lens portion has a substantially hemispherical shape, and
    wherein a substantially hexagonal shape of the first light emitting element overlaps with a substantially hexagonal shape of the first fixing portion.

12. The light emitting device according to claim 1, wherein an upper surface of the fluorescent material is as high as or higher than the first front surface and the second front surface.

13. The light emitting device according to claim 1, wherein the fluorescent material absorbs the third light to emits a fourth light having a peak wavelength in a range from 584 nm to 780 nm.

14. The light emitting device according to claim 1, wherein a reflecting film to reflect the third light is disposed on an upper surface of the fluorescent material.

15. The light emitting device according to claim 1, wherein each of the first light emitting element, the second light emitting element, and the third light emitting element includes a nitride semiconductor layer.

16. The light emitting device according to claim 9,
    wherein the second lens includes a second fixing portion connected to the second lens portion to cover at least a side surface of the second light emitting element, wherein the third lens includes a third fixing portion connected to the third lens portion to cover at least a side surface of the third light emitting element, and wherein the first fixing portion, the second fixing portion, and the third fixing portion are connected.

17. The light emitting device according to claim 16, further comprising:

a light-shielding film covering upper surfaces of the first fixing portion, the second fixing portion, and the third fixing portion without covering the first lens portion, the second lens portion, and the third lens portion.

18. A display device comprising a plurality of the light emitting devices according to claim 1.

19. The light emitting device according to claim 1, wherein the film is provided to surround an entirety of the fluorescent side surface of the fluorescent material.

20. The light emitting device according to claim 1, wherein the film is provided on the fluorescent side surface of the fluorescent material.

21. A light emitting device comprising:

a first light emitting element to emit from a first front surface a first light having a peak wavelength in a range from 440 nm to 485 nm, the first front surface having a polygonal shape with five or more sides and being substantially perpendicular to a front-rear direction of the light emitting device;

a second light emitting element to emit from a second front surface a second light having a peak wavelength in a range from 495 nm to 573 nm, the second front surface having a polygonal shape with five or more sides and being substantially perpendicular to the front-rear direction;

a third light emitting element including a third front surface, a bottom surface opposite to the third front surface in the front-rear direction, and a side surface connecting the third front surface and the bottom surface, the third light emitting element being configured to emit from the third front surface a third light having a peak wavelength in a range from 440 nm to 485 nm, the third front surface having a polygonal shape with five or more sides and being substantially perpendicular to the front-rear direction;

a fluorescent material provided on the third front surface of the third light emitting element and having a fluorescent side surface extending along the front-rear direction;

a film provided to surround the side surface of the third light emitting element and the fluorescent side surface of the fluorescent material;

a first lens provided over the first front surface of the first light emitting element;

a second lens provided over the second front surface of the second light emitting element; and a third lens provided over the third front surface of the third light emitting element, wherein the fluorescent material absorbs the third light to emits a fourth light having a peak wavelength in a range from 584 nm to 780 nm, and wherein each of the first light emitting element, the second light emitting element, and the third light emitting element includes a nitride semiconductor layer.

22. The light emitting device according to claim 20, wherein the film is provided to surround an entirety of the fluorescent side surface of the fluorescent material.

23. The light emitting device according to claim 20, wherein the film is provided on the fluorescent side surface of the fluorescent material.

* * * * *